United States Patent
Kariyada et al.

(10) Patent No.: US 8,830,735 B2
(45) Date of Patent: Sep. 9, 2014

(54) MAGNETIC MEMORY INCLUDING MEMORY CELLS INCORPORATING DATA RECORDING LAYER WITH PERPENDICULAR MAGNETIC ANISOTROPY FILM

(75) Inventors: Eiji Kariyada, Kanagawa (JP); Katsumi Suemitsu, Kanagawa (JP); Hironobu Tanigawa, Kanagawa (JP); Kaoru Mori, Kanagawa (JP); Tetsuhiro Suzuki, Kanagawa (JP); Kiyokazu Nagahara, Kanagawa (JP); Yasuaki Ozaki, Kanagawa (JP); Norikazu Ohshima, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 131 days.

(21) Appl. No.: 13/304,083

(22) Filed: Nov. 23, 2011

(65) Prior Publication Data
US 2012/0135275 A1   May 31, 2012

(30) Foreign Application Priority Data

Nov. 26, 2010 (JP) ............................... 2010-264298
Jan. 31, 2011 (JP) ............................... 2011-017965
Oct. 28, 2011 (JP) ............................... 2011-237544

(51) Int. Cl.
| | |
|---|---|
| *G11B 5/66* | (2006.01) |
| *G11C 11/16* | (2006.01) |
| *G01R 33/09* | (2006.01) |
| *G11C 11/02* | (2006.01) |
| *G11C 11/14* | (2006.01) |
| *G11C 11/15* | (2006.01) |

(52) U.S. Cl.
CPC .............. *G11C 11/02* (2013.01); *G11C 11/161* (2013.01); *G01R 33/091* (2013.01); *G01R 33/098* (2013.01); *G11C 11/14* (2013.01); *G11C 11/15* (2013.01)

USPC ..................... 365/158; 428/811.1; 428/811.2; 428/811.5

(58) Field of Classification Search
None
See application file for complete search history.

(56) References Cited

U.S. PATENT DOCUMENTS

| | | | |
|---|---|---|---|
| 6,834,005 B1 | 12/2004 | Parkin | |
| 8,559,214 B2 * | 10/2013 | Fukami et al. | ............... 365/158 |

(Continued)

FOREIGN PATENT DOCUMENTS

| | | |
|---|---|---|
| JP | 2005-191032 A | 7/2005 |
| JP | 2006-114162 A | 4/2006 |
| WO | WO 2009/001706 A1 | 12/2008 |

OTHER PUBLICATIONS

N. Sakimura, et al., "MRAM Cell Technology for Over 500-MHz SoC", IEEE Journal of Solid-State Circuits, vol. 42, No. 4, pp. 830-838, 2007.

(Continued)

*Primary Examiner* — Kevin Bernatz
(74) *Attorney, Agent, or Firm* — McGinn IP Law Group, PLLC

(57) ABSTRACT

A magnetic memory includes: a magnetization fixed layer having perpendicular magnetic anisotropy, a magnetization direction of the magnetization fixed layer being fixed; an interlayer dielectric; an underlayer formed on upper faces of the magnetization fixed layer and the interlayer dielectric; and a data recording layer formed on an upper face of the underlayer and having perpendicular magnetic anisotropy. The underlayer includes: a first magnetic underlayer; and a non-magnetic underlayer formed on the first magnetic underlayer. The first magnetic underlayer is formed with such a thickness that the first magnetic underlayer does not exhibit in-plane magnetic anisotropy in a portion of the first magnetic underlayer formed on the interlayer dielectric.

5 Claims, 41 Drawing Sheets

(56) References Cited

U.S. PATENT DOCUMENTS

| | | | |
|---|---|---|---|
| 2005/0185455 A1* | 8/2005 | Huai | 365/171 |
| 2006/0083951 A1 | 4/2006 | Arai et al. | |
| 2009/0213503 A1* | 8/2009 | Sun et al. | 360/324.2 |
| 2010/0020592 A1* | 1/2010 | Hosotani et al. | 365/158 |
| 2010/0188890 A1 | 7/2010 | Fukami et al. | |
| 2010/0230770 A1* | 9/2010 | Yoshikawa et al. | 257/421 |
| 2011/0012215 A1* | 1/2011 | Nguyen et al. | 257/421 |
| 2012/0168885 A1* | 7/2012 | Apalkov et al. | 257/421 |

OTHER PUBLICATIONS

A. Yamaguchi, et al., "Real-Space Observation of Current-Driven Domain Wall Motion in Submicron Magnetic Wires", Physical Review Letters, vol. 92, No. 7, 077205, 2004.

S. Fukami, et al., "Micromagnetic analysis of current driven domain wall motion in nanostrips with perpendicular magnetic anisotropy", Journal of Applied Physics, vol. 103, 07E718, (2008).

A. Thiaville, et al., "Domain wall motion by spin-polarized current: a micromagnetic study", Journal of Applied Physics, vol. 95, No. 11, pp. 7049-7051, 2004.

G.H.O. Daalderop, et al., "Prediction and Confirmation of Perpendicular Co/Ni Multilayers", Physical Review Letters, vol. 68, No. 5, pp. 682-685, 1992.

"Evaluation of Scalability for Current-Driven Domain Wall Motion in a Co/Ni Multilayer Strip for Memory Applications", IEEE Transactions on Magnetics, vol. 45, No. 10, pp. 3776-3779, (2009).

F.J. A. den Broeder, et al., "Perpendicular Magnetic Anisotropy and Coercivity of Co/Ni Multilayers", IEEE Transactions on Magnetic, vol. 28, No. 5, pp. 2760-2765, (1992).

* cited by examiner

Fig. 5A

| Pt FILM THICKNESS (nm) | COUPLING FIELD (Oe) |
|---|---|
| 0.3 | 1720 |
| 0.5 | 1960 |
| 1.0 | 1975 |
| 1.5 | 1940 |
| 2.0 | 1965 |
| 2.5 | 1905 |
| 3.0 | 1900 |
| 4.0 | 1915 |
| 4.5 | 0 |
| 5.0 | 0 |

Fig. 5B

| Pd FILM THICKNESS (nm) | COUPLING FIELD (Oe) |
|---|---|
| 0.3 | 1630 |
| 0.5 | 1940 |
| 1.0 | 1963 |
| 1.5 | 1950 |
| 2.0 | 1974 |
| 2.5 | 1952 |
| 3.0 | 1930 |
| 4.0 | 1910 |
| 4.5 | 45 |
| 5.0 | 0 |

Fig. 5C

| Ir FILM THICKNESS (nm) | COUPLING FIELD (Oe) |
|---|---|
| 0.3 | 1700 |
| 0.5 | 1965 |
| 1.0 | 1960 |
| 1.5 | 1957 |
| 2.0 | 1965 |
| 2.5 | 1950 |
| 3.0 | 1945 |
| 4.0 | 1930 |
| 4.5 | 0 |
| 5.0 | 0 |

MAGNETIC MEMORY INCLUDING MEMORY CELLS INCORPORATING DATA RECORDING LAYER WITH PERPENDICULAR MAGNETIC ANISOTROPY FILM

INCORPORATION BY REFERENCE

This application claims the benefit of priority based on Japanese Patent Application No. 2010-264298 filed on Nov. 26, 2010, No. 2011-17965 filed on Jan. 31, 2011, and No. 2011-237544 filed on Oct. 28, 2011, the disclosure of which is incorporated herein by reference.

BACKGROUND

The present invention relates to a magnetic memory, more particularly, to a magnetic memory using a magnetic film with perpendicular magnetic anisotropy (PMA) as a data recording layer in each memory cell.

The magnetic memory or magnetic random access memory (MRAM) is a non-volatile memory which achieves high speed operation and infinite rewriting tolerance. This encourages practical use of MRAMs in specific applications, and promotes development for expanding the versatility of the MRAMs. A magnetic memory uses magnetic films as memory elements and stores data as the magnetization directions of the magnetic films. In writing desired data into a magnetic film, the magnetization of the magnetic film is switched into the direction corresponding to the data. Various methods have been proposed for the switching of the magnetization direction, but all of the proposed methods are the same in that a current (or write current) is used. It is of much importance to reduce the write current in realizing practical use of MRAMs. The importance of the reduction in the write current is discussed in, for example, N. Sakimura et al., "MRAM Cell Technology for Over 500-MHz SoC", IEEE JOURNAL OF SOLID-STATE CIRCUITS, VOL. 42, No. 4, pp. 830-838, 2007.

One approach for reducing the write current is to use "current driven domain wall motion" in data writing. As disclosed in A. Yamaguchi et al., "Real-Space Observation of Current-Driven Domain Wall Motion in Submicron Magnetic Wires", PHYSICAL REVIEW LETTERS, VOL. 92, No. 7, 077205, 2004, when a current is flown in the direction through a domain wall, the domain wall is moved in the direction of the conduction electrons. Therefore, by flowing a write current through a data recording layer, the domain wall is moved in the direction corresponding to the current direction, to thereby write desired data. An MRAM based on current driven domain wall motion is disclosed in, for example, Japanese Patent Application Publication No. 2005-191032 A.

Furthermore, a magnetic shift register based on spin injection is disclosed in U.S. Pat. No. 6,834,005. This magnetic shift register records data by using domain walls formed in a magnetic body. When a current is injected through domain walls in a magnetic body which is divided into a large number of regions (or magnetic domains), the domain walls are moved by the current. The magnetization direction of each region is defined as recorded data. Such magnetic shift register is used for, for example, recording a large amount of serial data.

It is known in the art that the write current is further reduced by using a magnetic film with perpendicular magnetic anisotropy as a data recording layer in a magnetic memory which achieves data write based on current driven domain wall motion. Such technique is disclosed in, for example, S. Fukami et al., "Micromagnetic analysis of current driven domain wall motion in nanostrips with perpendicular magnetic anisotropy", JOURNAL OF APPLIED PHYSICS, VOL. 103, 07E718, (2008).

Furthermore, international publication No. WO2009/001706 A1 discloses a magnetic memory in which a magnetic film with perpendicular magnetic anisotropy is used as a data recording layer and data writing is achieved by current driven domain wall motion. FIG. 1 is a section view schematically showing a magnetoresistance effect element 200 integrated in the disclosed magnetic memory. The magnetoresistance effect element 200 includes a data recording layer 110, a spacer layer 120 and a reference layer 130. The data recording layer 110 is formed of a magnetic film with perpendicular magnetic anisotropy. The spacer layer 120 is formed of a non-magnetic dielectric layer. The reference layer 130 is formed of a magnetic layer having a fixed magnetization.

The data recording layer 110 includes a pair of magnetization fixed regions 111a and 111b, and a magnetization free region 113. The magnetization fixed regions 111a and 111b are disposed across the magnetization free region 113. The magnetizations of the magnetization fixed regions 111a and 111b are fixed in the opposite directions (or in antiparallel) by magnetization fixed layers 115a and 115b, respectively. More specifically, the magnetization direction of the magnetization fixed region 111a is fixed in the +z direction by the magnetic coupling with the magnetization fixed layer 115a, and the magnetization direction of the magnetization fixed region 111b is fixed in the −z direction by the magnetic coupling with the magnetization fixed layer 115b. The magnetization direction of the magnetization free region 113, on the other hand, is reversible between +z and −z directions by a write current which flows from one of the magnetization fixed regions 111a and 111b to the other. As a result, a domain wall 112a or 112b is formed in the data recording layer 110 depending on the magnetization direction of the magnetization free regions 113. Data are stored as the magnetization direction of the magnetization free region 113. Data may be considered as being stored as the position of the domain wall (which is indicated by the numeral 112a or 112b).

The reference layer 130, the spacer layer 120 and the magnetization free region 113 of the data recording layer 110 form a magnetic tunnel junction (MTJ). The resistance of the MTJ varies depending on the magnetization direction of the magnetization free region 113, that is, the data written into the data recording layer 110. The data are read as the magnitude of the resistance of the MTJ.

One important issue of a magnetic memory which uses a data recording layer with perpendicular magnetic anisotropy is to enhance the perpendicular magnetic anisotropy of the data recording layer. When a Co/Ni film stack (a stack in which thin Co films and Ni films are alternately laminated) is used as the data recording layer, for example strong perpendicular magnetic anisotropy can be achieved by forming the Co/Ni film stack so as to exhibit high fcc (111) orientation; however, it is not so easy to form a Co/Ni film stack with sufficiently high fcc (111) orientation.

Japanese Patent Application Publication No. 2006-114162 A discloses a perpendicular magnetic recording medium including an adhesion layer, a soft magnetic underlayer, an intermediate layer and a perpendicular recording layer, which are laminated in series over a substrate. This patent document discloses a technique for improving the magnetic characteristics and surface smoothness of the soft magnetic underlayer and for further enhancing the adhesiveness with the substrate. Specifically, the adhesion layer is composed of first and second underlayers. The first underlayer is formed of alloy of at least two elements selected from the group consisting of nickel (Ni), aluminum (Al), titanium (Ti), tantalum (Ta), chromium (Cr) and cobalt (Co), and the second underlayer is formed of metal tantalum or amorphous alloy including Ta doped with at least one element selected from the group consisting of Ni, Al, Ti, Cr and Zr.

F. J. A. den Broeder et al., "Perpendicular Magnetic Anisotropy and Coercivity of Co/Ni Multilayers", IEEE TRANSACTIONS ON MAGNETICS, VOL. 28, NO. 5, pp. 2760-2765, (1992) discloses that film deposition on a glass substrate without any underlayer results in strong anisotropy in the in-plane direction, and discusses that an underlayer is necessary to achieve perpendicular magnetic anisotropy. This non-patent document discloses that a gold (Au) film with (111) orientation is a preferred underlayer. It should be noted here that the underlayer disclosed in this non-patent document is formed of non-magnetic material and has a thickness of 20 nm or more.

Use of a thick non-magnetic layer as an underlayer as disclosed in this non-patent document is not preferable for the magnetic memory shown in FIG. 1, in which the magnetizations of the magnetization fixed regions of the data recording layer are fixed by the magnetization fixed layers formed under the data recording layer. When an underlayer is used in the magnetic memory shown in FIG. 1, for example, the underlayer is inserted between the data recording layer 110 and the magnetization fixed layers 115a and 115b. In this case, the magnetic coupling between the data recording layer 110 and the magnetization fixed layers 115a and 115b may be broken by the insertion of a thick non-magnetic layer as the underlayer, resulting in that the magnetizations of the magnetization fixed regions 111a and 111b are loosed. This is unpreferable for normally operating the magnetic memory.

SUMMARY

Therefore, an objective of the present invention is to provide a magnetic memory including a data recording layer with perpendicular magnetic anisotropy, wherein the data recording layer has sufficiently strong perpendicular magnetic anisotropy and the magnetic coupling between the data recording layer and a magnetization fixed layer disposed under the data recording layer is sufficiently enhanced.

In an aspect of the present invention, a magnetic memory includes: a magnetization fixed layer having perpendicular magnetic anisotropy, a magnetization direction of the magnetization fixed layer being fixed; an interlayer dielectric; an underlayer formed on upper faces of the magnetization fixed layer and the interlayer dielectric; and a data recording layer formed on an upper face of the underlayer and having perpendicular magnetic anisotropy. The underlayer includes: a first magnetic underlayer; and a non-magnetic underlayer formed on the first magnetic underlayer. The first magnetic underlayer is formed with such a thickness that the first magnetic underlayer does not exhibit in-plane magnetic anisotropy in a portion of the first magnetic underlayer formed on the interlayer dielectric.

In another aspect of the present invention, a magnetic memory includes: a magnetization fixed layer having perpendicular magnetic anisotropy; an interlayer dielectric; an underlayer formed on upper faces of the magnetization fixed layer and the interlayer dielectric; and a data recording layer formed on an upper face of the underlayer and having perpendicular magnetic anisotropy. The magnetization fixed layer has a fixed magnetization direction. The underlayer includes: a first magnetic underlayer; and a non-magnetic underlayer formed on the first magnetic underlayer. The first magnetic underlayer includes NiFe as major constitution and includes at least one non-magnetic element selected from the group consisting of Zr, Ta, W, Hf and V. The thickness of the first magnetic underlayer is in a range from 0.5 to 3 nm.

In still another aspect of the present invention, a magnetic memory includes: a magnetization fixed layer having perpendicular magnetic anisotropy, a magnetization direction of the magnetization fixed layer being fixed; an interlayer dielectric; an underlayer formed on upper faces of the magnetization fixed layer and the interlayer dielectric; and a data recording layer formed on an upper face of the underlayer and having perpendicular magnetic anisotropy. The underlayer includes: a first magnetic underlayer; and a non-magnetic underlayer formed on the first magnetic underlayer. The first magnetic underlayer includes Co or Fe as major constitution and includes at least one non-magnetic element selected from the group consisting of Zr, Ta, W, Hf and V. The thickness of the first magnetic underlayer is in a range from 0.5 to 3 nm.

In still another aspect of the present invention, a magnetic memory includes: a ferromagnetic underlayer formed of magnetic material; a non-magnetic intermediate layer disposed on the underlayer; a ferromagnetic data recording layer formed on the intermediate layer and having perpendicular magnetic anisotropy; a reference layer connected to the across a non-magnetic layer; and first and second magnetization fixed layers disposed in contact with a bottom face of the underlayer. The data recording layer includes: a magnetization free region having a reversible magnetization and opposed to the reference layer; a first magnetization fixed region coupled to a first border of the magnetization free layer and having a magnetization fixed in a first direction; and a second magnetization fixed region coupled to a second border of the magnetization free layer and having a magnetization fixed in a second direction opposite to the first direction. The intermediate layer is formed of a Ta film having a thickness of 0.1 to 2.0 nm.

The present invention provides a magnetic memory including a data recording layer with perpendicular magnetic anisotropy, wherein the data recording layer has sufficiently strong perpendicular magnetic anisotropy and the magnetic coupling between the data recording layer and a magnetization fixed layer disposed under the data recording layer is sufficiently enhanced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5A is a table showing the change in the coupling field exerted across a Pt film corresponding to a non-magnetic underlayer against the Pt film thickness;

FIG. 5B is a table showing the change in the coupling field exerted across a Pd film corresponding to a non-magnetic underlayer against the Pd film thickness;

FIG. 5C is a table showing the change in the coupling field exerted across an Ir film corresponding to a non-magnetic underlayer against the Ir film thickness;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention are described below with reference to the attached drawings.

First Embodiment

Figure 1:
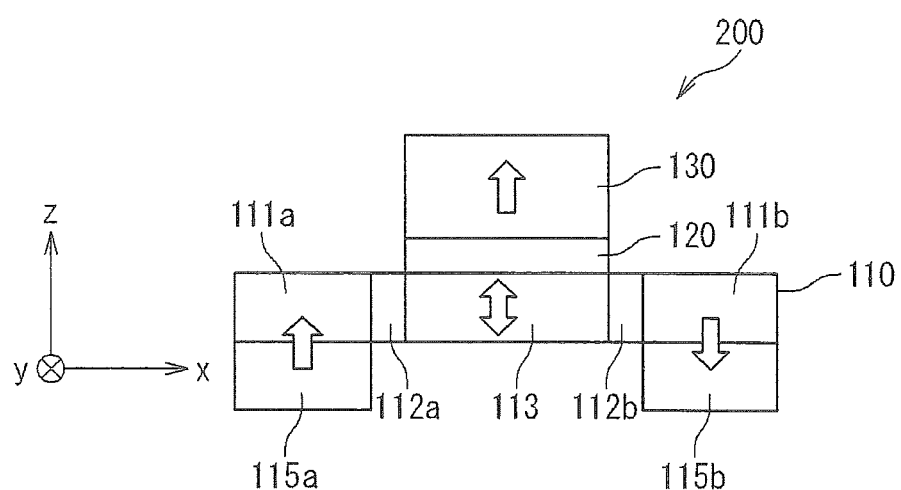
FIG. 1 is a section view showing an exemplary configuration of a conventional magnetoresistance effect element.
Figure 2:
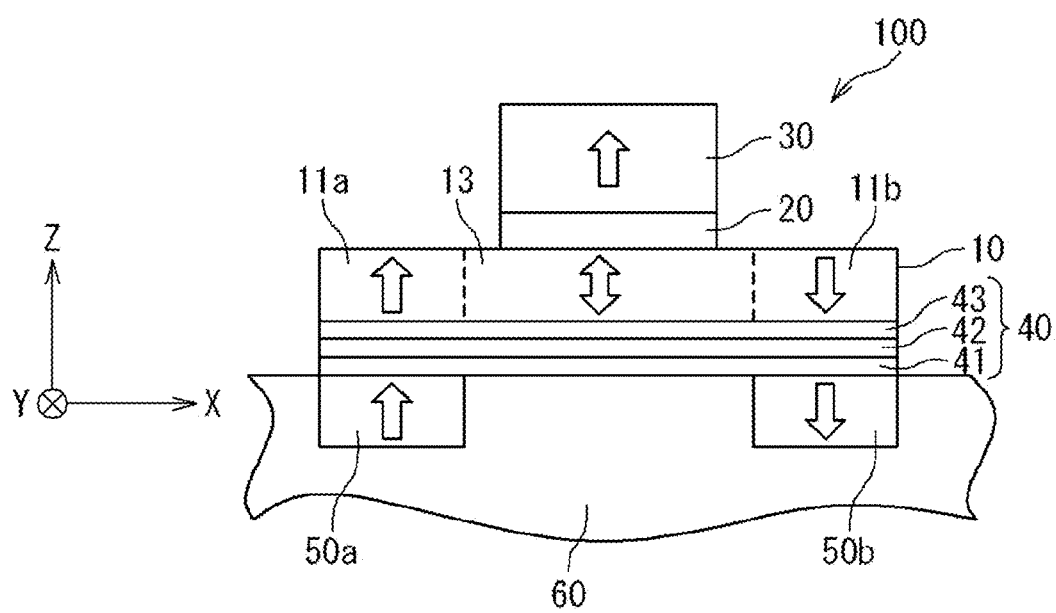
FIG. 2 is a section view schematically showing an exemplary configuration of a magnetoresistance effect element of a first embodiment of the present invention.

FIG. 2 is a section view schematically showing an exemplary configuration of a magnetoresistance element 100 in a first embodiment of the present invention. The magnetoresistance effect element 100 includes a data recording layer 10, a spacer layer 20, a reference layer 30, an underlayer 40 and magnetization fixed layers 50a and 50b.

The data recording layer 10 is formed of ferromagnetic material with perpendicular magnetic anisotropy. The data recording layer 10 includes a region in which the magnetization direction is reversible and stores data as the magnetization state thereof. In detail, the data recording layer 10 includes a pair of magnetization fixed regions 11a and 11b and a magnetization free region 13.

The magnetization fixed regions 11a and 11b are disposed adjacent to the magnetization free region 13. The magnetizations of the magnetization fixed regions 11a and 11b are fixed in opposite directions (or in antiparallel). In the example shown in FIG. 2, the magnetization direction of the magnetization fixed region 11a is fixed in the +z direction and that of the magnetization fixed region 11b is fixed in the −z direction.

Figure 3A:
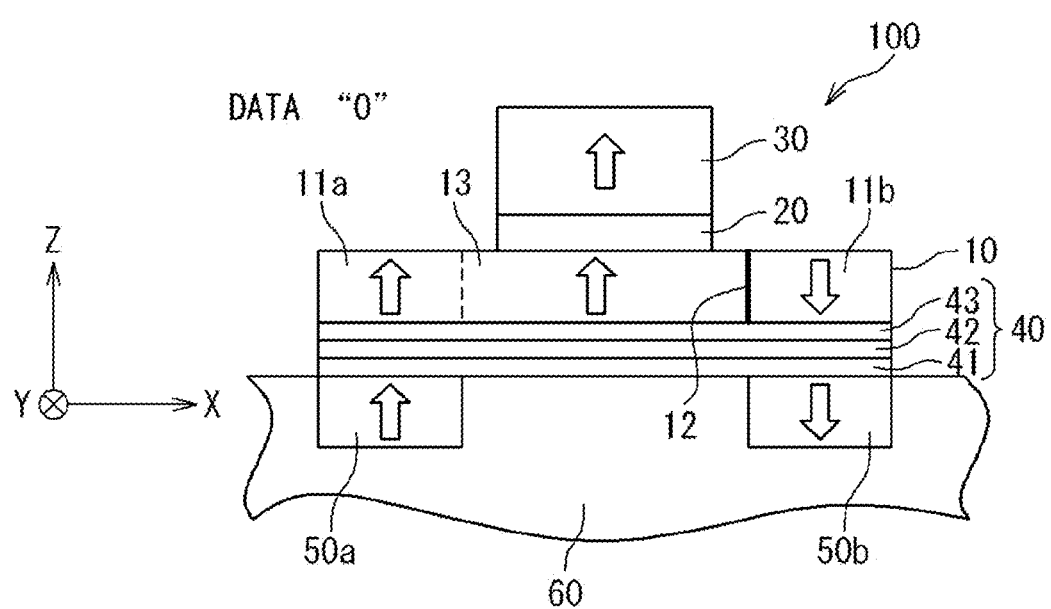
FIG. 3A is a diagram schematically showing the state of the magnetoresistance effect element into which data "0" are written.

The magnetization of the magnetization free region 13 is reversible between the +z and −z directions. Therefore, a domain wall is formed in the data recording layer 10 in accordance with the magnetization direction of the magnetization free region 13. In detail, as shown in FIG. 3A, a domain wall 12 is formed between the magnetization free region 13 and the magnetization fixed region 11b, when the magnetization direction of the magnetization free region 13 is directed in the +z direction. When the magnetization direction of the magnetization free region 13 is directed in the −z direction, on the other hand, the domain wall 12 is formed between the magnetization free region 13 and the magnetization fixed region 11a. In other words, the data recording layer 10 incorporates the domain wall 12, and the position of the domain wall 12 depends on the magnetization direction of the magnetization free region 13.

The spacer layer 20 is disposed adjacent to the data recording layer 10. The spacer layer 20 is disposed in contact with at least the upper face of the magnetization free region 13 of the data recording layer 10. The spacer layer 20 is formed of non-magnetic dielectric material.

The reference layer 30 is disposed in contact with the upper face of the spacer layer 20. That is, the reference layer 30 is coupled to the data recording layer 10 (the magnetization free region 13) across the spacer layer 20. As is the case with the data recording layer 10, the reference layer 30 is also formed of ferromagnetic material with perpendicular magnetic anisotropy, and the magnetization direction thereof is fixed in the +z or −z direction. In the example of FIG. 2, the magnetization direction of the reference layer 30 is fixed in the +z direction.

The aforementioned magnetization free region 13 of the data recording layer 10, the spacer layer 20 and the reference layer 30 form a magnetic tunnel junction (MTJ). That is, the data recording layer 10 (the magnetization free region 13), the space layer 20 and the reference layer 30 function as a free layer, a barrier layer and a pinned layer in an MTJ, respectively.

The underlayer 40 is disposed on the bottom face of the data recording layer 10 (which is opposed to the substrate). The underlayer 40 is used for improving the crystalline orientation of the data recording layer 10 to achieve strong perpendicular magnetization anisotropy in the data recording layer 10. The structure and function of the underlayer 40 will be discussed in detail later.

The magnetization fixed layers 50a and 50b are formed of magnetically-hard ferromagnetic material with perpendicular magnetic anisotropy, and the magnetization directions of the magnetization fixed layers 50a and 50b are fixed in the +z and −z directions, respectively. The magnetization fixed layers 50a and 50b are used to fix the magnetizations of the magnetization fixed regions 11a and 11b of the data recording layer 10. The magnetization of the magnetization fixed region 11a is fixed by the magnetic coupling with the magnetization fixed layer 50a and the magnetization of the magnetization fixed region 11b is fixed by the magnetic coupling with the magnetization fixed layer 50b. In this embodiment, the magnetization fixed layers 50a and 50b are embedded in the grooves formed on an interlayer dielectric 60. In this embodiment, CoPt alloy films or Co/Pt film stacks (film stacks in which thin Co films and Pt films are alternately laminated) are used as the magnetization fixed layers 50a and 50b. These hard magnetic materials exhibit strong perpendicular magnetic anisotropy.

The interlayer dielectric 60 is a dielectric film for interlayer isolation generally used in a semiconductor integrated circuit. A SiOx film, SiN film or a film stack of these films is used as the interlayer dielectric 60.

It should be noted that electrode layers (not shown) are electrically connected to the magnetization fixed regions 11a and 11b of the data recording layer 10, respectively. These electrode layers are used to introduce a write current into the data recording layer 10. In one embodiment, the electrode layers may be connected to the magnetization fixed regions 11a and 11b of the data recording layer 10 via the aforementioned magnetization fixed layers 50a and 50b. Also, another electrode layer (not shown) is electrically connected to the reference layer 30.

In the magnetoresistance effect element 100, two memory states are allowed which correspond to two magnetization states of the data recording layer 10, that is, two allowed positions of the domain wall in the data recording layer 10. When the magnetization direction of the magnetization free region 13 of the data recording layer 10 is directed in the +z direction as shown in FIG. 3A, a domain wall 12 is formed on the border between the magnetization free region 13 and the magnetization fixed region 11b. In this case, the magnetization directions of the magnetization free region 13 and the reference layers 30 are parallel to each other. Therefore, the resistance of the MTJ is relatively decreased. Such magnetization state is correlated to the memory state of, for example, data "0".

Figure 3B:
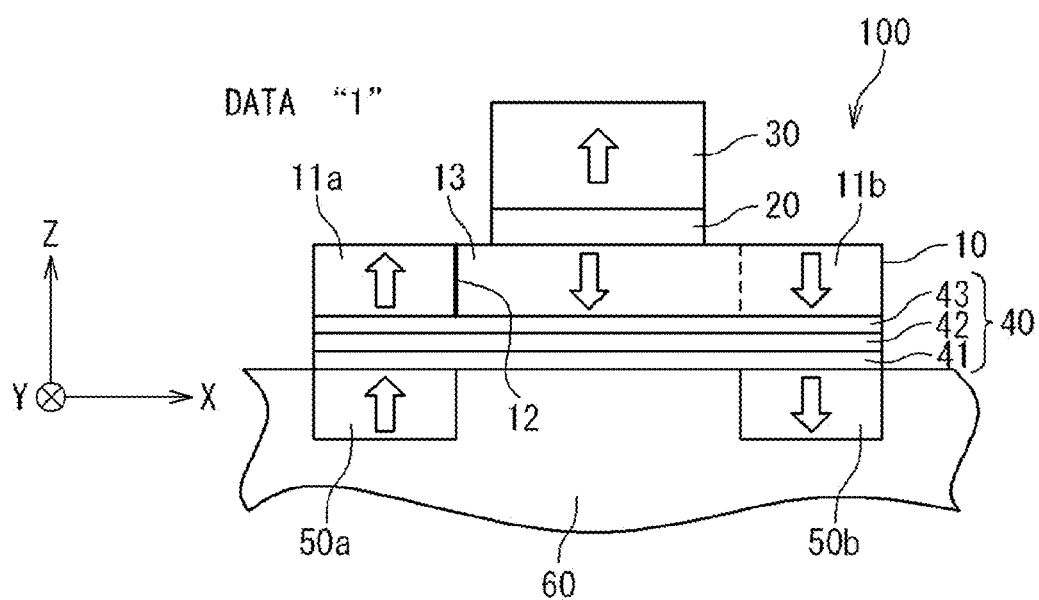
FIG. 3B is a diagram schematically showing the state of the magnetoresistance effect element into which data "1" are written.

When the magnetization direction of the magnetization free region 13 of the data recording layer 10 is directed in the −z direction as shown in FIG. 3B, on the other hand, the domain wall is formed on the border between the magnetization free region 13 and the magnetization fixed region 11a. In this case, the magnetization directions of the magnetization free region 13 and the reference layers 30 are antiparallel to each other. Therefore, the resistance of the MTJ is relatively increased. Such magnetization state is correlated to the memory state of, for example, data "1".

It should be noted that the correlation between the magnetization state of the data recording layer 10 and the two memory states are not limited to that mentioned above. The data recording layer 10 incorporates the domain wall 12, and the position of the domain wall 12 corresponds to the magnetization direction of the magnetization free region 13. As a result, the data recording layer 10 stores data as the position of the domain wall 12.

In the magnetoresistance effect element 100 of this embodiment, data writing is achieved by using current driven domain wall motion. In order to write data "1" into the magnetoresistance effect element 100 when the magnetoresistance effect element 100 previously stores data "0" (where the magnetization directions of the magnetization free region 13 and the reference layer 30 are parallel), a write current is flown from the magnetization fixed region 11a to the magnetization fixed region 11b via the magnetization free region 13. In this case, conduction electrons move from the magnetization fixed region 11b to the magnetization fixed region 11a via the magnetization free region 13. As a result, a spin transfer torque (STT) is exerted on the domain wall 12 which is positioned at the border between the magnetization fixed region 11b and the magnetization free region 13, and the domain wall 12 moves toward the magnetization fixed region 11a. In other words, a current drive domain wall motion occurs. The current density of the write current is decreased in the magnetization fixed region 11a, when the write current passes through the border between the magnetization fixed region 11a and the magnetization free region 13. The motion of the domain wall 12 is therefore stopped near the border. In this way, the domain wall 12 is moved near the border between the magnetization fixed region 11a and the magnetization free region 13 to achieve data writing of data "1".

In order to write data "0" into the magnetoresistance effect element 100 when the magnetoresistance effect element 100 previously stores data "1" (where the magnetization directions of the magnetization free region 13 and the reference layer 30 are antiparallel), on the other hand, a write current is flown from the magnetization fixed region 11b to the magnetization fixed region 11a via the magnetization free region 13. In this case, conduction electrons move from the magnetization fixed region 11a to the magnetization fixed region 11b via the magnetization free region 13. As a result, a spin transfer torque is exerted on the domain wall 12 which is positioned at the border between the magnetization fixed region 11a and the magnetization free region 13, and the domain wall 12 moves toward the magnetization fixed region 11b. In other words, a current drive domain wall motion occurs. The current density of the write current is decreased in the magnetization fixed region 11b, when the write current passes through the border between the magnetization fixed region 11b and the magnetization free region 13. The motion of the domain wall 12 is therefore stopped near the border. In this way, the domain wall 12 is moved near the border between the magnetization fixed region 11b and the magnetization free region 13 to achieve data writing of data "0".

It should be noted that no change occurs in the magnetization state when data "0" are written in the state in which data "0" are previously stored, or when data "1" are written in the state in which data "1" are previously stored. This means that the magnetoresistance effect element 100 is adapted to overwriting.

The data reading is achieved by using the tunneling magnetoresistive (TMR) effect. Specifically, a read current is flown in the data reading through the MTJ (composed of the magnetization free region 13 of the data recording layer 10, the spacer layer 20 and the reference layer 30). The direction of the read current may be reversed. The resistance of the MTJ is relatively decreased when data "0" are stored in the magnetoresistance effect element 100. On the other hand, the resistance of the MTJ is relatively increased when data "1" are stored in the magnetoresistance effect element 100. Therefore, data can be identified by detecting the resistance of the MTJ.

Next, a description is given of a preferred structure of the data recording layer 10. Desired characteristics of the data recording layer 10 include small saturation magnetization and large spin polarizability. As disclosed in A. Thiaville et al., "Domain wall motion by spin-polarized current: a micromagnetic study", JOURNAL OF APPLIED PHYSICS, VOL. 95, No. 11, pp. 7049-7051, 2004, the current driven domain wall motion occurs more easily as the parameter $g\mu_B P/2eM_s$ is large, where g is the Landé g factor; $\mu_B$ is the Bohr magneton; P is the spin polarizability; e is the elementary electric charge; and $M_s$ is the saturation magnetization. Since g, $\mu_B$ and e are physical constants, it is effective for reducing the write current to decrease the saturation magnetization $M_s$ of the data recording layer 10 and to increase the spin polarizability P.

First, alternate film stacks of transition metals, such as Co/Ni, Co/Pt, Co/Pd, CoFe/Ni, CoFe/Pt and CoFe/Pd, are promising as the magnetic film with perpendicular magnetic anisotropy used for the data recording layer 10 in terms of the saturation magnetization. It is known in the art that the saturation magnetizations of these materials are relatively small. More generally, the data recording layer 10 may be structured as a film stack in which first and second layers are layered. The first layer includes any of an Fe film, a Co film and a Ni film or an alloy film formed of a plurality of materials selected from the group consisting of Fe, Co and Ni. The second layer includes any of a Pt film, a Pd film, a Au film, a Ag film, a Ni film and a Cu film, or an alloy film formed of a plurality of materials selected from the group consisting of Pt, Pd, Au, Ag, Ni and Cu.

Among the above-described film stacks, the Co/Ni film stack especially has a high spin polarizability. Therefore, a Co/Ni film stack is especially preferable as the data recording layer 10. Actually, the inventors have confirmed by experiments that the use of a Co/Ni film stack enables domain wall motion with high controllability An alternate film stack of transition metals (for example, a Co/Ni film stack) exhibits perpendicular magnetic anisotropy when being structured in an fcc (111)-oriented crystalline structure, in which the film stack has an fcc structure and the (111) faces are layered in the perpendicular direction of the substrate. According to G. H. O. Daalderop et al., "Prediction and Confirmation of Perpendicular Magnetic Anisotropy in Co/Ni Multilayers", PHYSICAL REVIEW LETTERS, VOL. 68, No. 5, pp. 682-685, 1992, the perpendicular magnetic anisotropy of the above-described film stacks originates from interfacial magnetic anisotropy at the interfaces therein. In order to provide improved perpendicular magnetic anisotropy for the data recording layer 10, it is therefore preferable to dispose an "underlayer" which enables growing an alternate film stack of transition metals with an improved fcc (111) orientation.

The magnetoresistance effect element 100 of this embodiment incorporates the underlayer 40, which enables growing the data recording layer 10 with an improved fcc (111) orientation to achieve improved perpendicular magnetic anisotropy.

In this embodiment, the underlayer 40 includes three layers: a first magnetic underlayer 41, a non-magnetic underlayer 42 and a second magnetic underlayer 43. The first magnetic underlayer 41 is formed to cover the upper faces of the magnetization fixed layers 50a and 50b and the upper face of a portion of the interlayer dielectric 60 positioned between the magnetization fixed layers 50a and 50b. The non-magnetic underlayer 42 is formed to cover the upper face of the first magnetic underlayer 41 and the second magnetic underlayer 43 is formed to cover the upper face of the non-magnetic underlayer 42.

The magnetic underlayer 41 is formed of material which intrinsically exhibits a ferromagnetic property, but with such a reduced thickness that the magnetic underlayer 41 does not exhibit ferromagnetism when formed on an amorphous film such as the interlayer dielectric 60. In this embodiment, the magnetic underlayer 41 includes NiFe as the major constituent and is doped with at least one non-magnetic element selected from the group consisting of Zr, Ta, W, Hf and V, wherein the concentration of the non-magnetic element(s) of the magnetic underlayer 41 ranges from 10 to 25 atomic % and the thickness of the magnetic underlayer 41 ranges from 0.5 to 3 nm. The non-magnetic underlayer 42 is formed of a non-magnetic film which has an fcc structure and exhibits a strong (111) orientation. In this embodiment, the non-magnetic underlayer 42 is formed of any of Pt, Au, Pd and Ir with a thickness of 0.3 to 4.0 nm. The second magnetic underlayer 43 is formed of a magnetic film stack in which first and second layers are alternately layered at least once, wherein the first layer consists of Pt or Pd and the second layer consists of Fe, Co or Ni.

Such combination of the first magnetic underlayer 41 and the non-magnetic underlayer 42 causes the data recording layer 10 to exhibit strong perpendicular magnetic anisotropy, while enhancing the magnetic coupling between the data recording layer 10 and the magnetization fixed layers 50a and 50b. Schematically, the properties of the first magnetic underlayer 41 and the non-magnetic underlayer 42 are different between the portion positioned on the interlayer dielectric 60 and the portions positioned on the magnetization fixed layers 50a and 50b. In general, a film formed on an amorphous film exhibits poor orientation. Therefore, the main issue is to form the data recording layer 10 in an fcc (111)-oriented structure to exhibit improved perpendicular magnetic anisotropy, for the portions of the first magnetic underlayer 41 and the non-magnetic underlayer 42 positioned over the interlayer dielectric film 60, which is formed of an amorphous film, such as a SiOx film and a SiN film. For the portions positioned over the magnetization fixed layers 50a and 50b, the main issue is to enhance the magnetic coupling between the data recording layer 10 and the magnetization fixed layers 50a and 50b; when the structure of the underlayer 40 is improper (for example, when a thick non-magnetic film is used as the underlayer 40 as is the case with the above-described conventional art), this undesirably weakens the magnetic coupling between the magnetic coupling between the data recording layer 10 and the magnetization fixed layers 50a and 50b. The combination of the first magnetic underlayer 41 and the non-magnetic underlayer 42 in this embodiment satisfies these two requirements at the same time.

Discussed first are the portions of the first magnetic underlayer 41 and the non-magnetic underlayer 42 positioned over the interlayer dielectric film 60. When formed on the interlayer dielectric 60, which is an amorphous film, the first magnetic underlayer 41 is grown as being amorphous due to a thin film thickness of 0.5 to 3.0 nm, enlarging the surface energy thereof. The portion of the first magnetic underlayer 41 in contact with the interlayer dielectric 60 is formed in a state in which there is substantially no magnetization, due to the amorphous growth process. The first magnetic underlayer 41 thus structured promotes the closest packed orientation (the orientation with the minimum surface energy face) of the crystalline formed thereon. Furthermore, the non-magnetic underlayer 42 formed on the first magnetic underlayer 41 is grown so that the closest packed face thereof is oriented to face the fcc (111) face, since the non-magnetic underlayer 42 is formed of any of Pt, Au, Pd and Ir, and a film formed of any of these materials intrinsically has the fcc structure. The data recording layer 10 can be formed with a strong perpendicular magnetic anisotropy by forming a magnetic film above the non-magnetic underlayer 42, wherein the magnetic film has an fcc structure and exhibits a strong perpendicular magnetic anisotropy for the (111) orientation. It should be noted that the data recording layer 10 can be formed with a strong perpendicular magnetic anisotropy due to the provision of the first magnetic underlayer 41, even when the non-magnetic underlayer 42 has a thin film thickness.

The portions of the first magnetic underlayer 41 and the non-magnetic underlayer 42 positioned over the magnetization fixed layers 50a and 50b, on the other hand, effectively enhances the magnetic coupling between the data recording layer 10 and the magnetization fixed layers 50a and 50b. For a case where the magnetization fixed layers 50a and 50b are formed of hard magnetic material, such as a Co/Pt film stack and a Co—Pt alloy film, as is the case of generally-used magnetization fixed layers, the magnetizations of portions of the first magnetic underlayer 41 are directed in the perpendicular directions which are the same directions of that of the magnetization fixed layers 50a and 50b, respectively, due to the magnetic interactions from the magnetization fixed layers 50a and 50b, when the first magnetic underlayer 41 and the non-magnetic underlayer 42 are subsequently layered over the magnetization fixed layers 50a and 50b. Such magnetic interactions fix the magnetizations of portions of the data recording layer 10 via the non-magnetic underlayer 42, resulting in that the magnetization fixed regions 11a and 11b are formed in the data recording layer 10. It should be noted that a strong magnetic coupling is achieved between the data recording layer 10 and the magnetization fixed layers 50a and 50b, due to the thin film thickness of the non-magnetic underlayer 42 (0.5 to 4.0 nm).

One may consider that there is a possibility in which the direct deposition of the first magnetic underlayer 41 on the interlayer dielectric 60 may cause an undesired magnetic influence which deteriorates the perpendicular magnetic anisotropy. That is, one may consider that the formation of the first magnetic underlayer 41 on the amorphous interlayer dielectric 60 may cause the first magnetic underlayer 41 to exhibit in-plane magnetic anisotropy, deteriorating the perpendicular magnetic anisotropy of the data recording layer 10; however, the first magnetic underlayer 41 does not actually cause an undesired magnetic influence which deteriorates the perpendicular magnetic anisotropy of the data recording layer 10, since the first magnetic underlayer 41 is formed so that the first magnetic underlayer 41 has substantially no magnetization in the portion disposed on the interlayer dielectric 60. Therefore, an improved perpendicular magnetic anisotropy is also achieved in the data recording layer 10.

The second magnetic underlayer 43 functions as a template of the crystalline orientation of the data recording layer 10 to improve the fcc (111) orientation of the data recording layer 10, enhancing the perpendicular magnetic anisotropy. In this embodiment, the second magnetic underlayer 43 is formed of a film stack in which first and second layers are layered at least once, wherein the first layer is formed of Pt or Pd and the second layer is formed of Fe, Co or Ni. The second magnetic underlayer 43 thus structured effectively improves the fcc (111) orientation of the data recording layer 10 formed of a Co/Ni film stack, enhancing the perpendicular magnetic anisotropy thereof. In addition, the second magnetic underlayer 43 thus structured allows adjustment of the perpendicular magnetic anisotropy of the data recording layer 10, by adjusting the numbers of the first and second layers layered in the second magnetic underlayer 43. It is preferable that the perpendicular magnetic anisotropy of the data recording layer 10 is adjusted into an appropriate range, since the write current may be increased if the perpendicular magnetic anisotropy of the data recording layer 10 is excessively strong.

It should be noted that the second magnetic underlayer 43 may be unnecessary when a magnetic film in which an fcc (111)-oriented structure is easily formed is used as the data recording layer 10. When a Co/Ni film stack is used as the data recording layer 10, for example, direct deposition of the data recording layer 10 on the non-magnetic underlayer 42 formed of Pt, Au, Pd or Ir does not result in strong perpendicular magnetic anisotropy. To address this problem, the use of the second magnetic underlayer 43 effectively achieves strong perpendicular magnetic anisotropy when a Co/Ni film stack, in which an fcc (111)-oriented structure is not easily formed, is used as the data recording layer 10. When a magnetic film in which a fcc (111)-oriented structure is easily formed (for example, a magnetic film stack which includes at least one first layer composed of Pt or Pd and at least one second layer composed of Fe, Co or Ni), is used as the data recording layer 10, on the other hand, the data recording layer 10 may be formed directly on the non-magnetic underlayer 42.

As discussed above, the use of the underlayer 40, which is formed as the film stack composed of the first magnetic underlayer 41, the non-magnetic underlayer 42 and the second magnetic underlayer 43, causes the data recording layer 10 to exhibit strong perpendicular magnetic anisotropy while enhancing the magnetic coupling between the data recording layer 10 and the magnetization fixed layers 50a and 50b. The inventors have confirmed the above-described facts through experiments. The experimental results are described below.

Experiment 1

Magnetic Property of First Magnetic Underlayer 41

First, a description is given of the magnetic property and a preferred thickness range of the first magnetic underlayer 41. In general, the property of the first magnetic underlayer 41 is different between the portion in contact with the interlayer dielectric 60 (formed of a SiN or SiOx film) and the portions in contact with the magnetization fixed layers 50a and 50b, as described above.

In order to study the portion of the first magnetic underlayer 41 in contact with the interlayer dielectric 60 (formed of a SiN or $SiO_2$ film), NiFeW films were deposited on substrates each including a SiN film or a SiOx film formed on a Si substrate, and the magnetizations of the NiFeW films were measured. The thicknesses of the deposited NiFeW films were in the range from 1 to 10 nm. The NiFeW films include 12.5 atomic % tungsten (W), and the remainder was NiFe base metal. The ratio of Ni to Fe in the NiFe base metal is Ni:Fe=77.5:22.5. All the samples were subjected to annealing at 350° C. for two hours in vacuum. A magnetic field is applied in the perpendicular direction to the film surface in the measurement of the magnetization of each sample. For a thickness range from 1 to 10 nm, the NiFeW films do not exhibit an M-H hysteresis loop of a rectangular shape and this confirms such NiFeW films are non-ferromagnetic films or in-plane magnetization films.

Figure 4A:
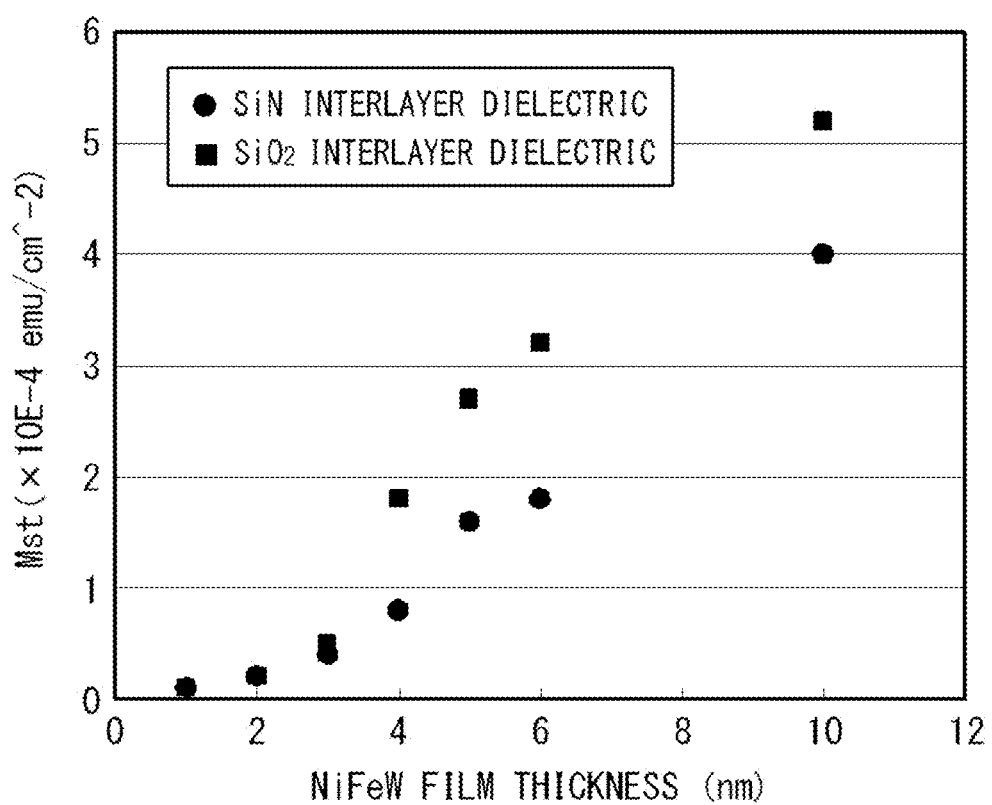
FIG. 4A is a graph showing the change in the magnitude of the magnetization of a NiFeW film against the film thickness.

FIG. 4A is a graph showing the change in the magnitude of the magnetization of the NiFeW film against the film thickness. As shown in FIG. 4A, the magnetization tends to monotonously increase as the film thickness increases for film thicknesses of 4 nm or more, regardless of which of SiN and SiOx films is disposed just beneath the NiFeW film. For film thicknesses of 0.5 nm to 3 nm, especially less than 2 nm, on the other hand, considerably-reduced magnetizations were observed compared to those of the NiFeW films of a film thickness of 4 nm or more, in both cases of the SiN film and the SiOx film. This result indicates that a NiFeW film does not exhibit magnetization with a thin film thickness, when the NiFeW film is deposited on the interlayer dielectric 60.

As thus described, the use of a NiFeW film of a thickness of 0.5 to 3 nm as the first magnetic underlayer 41 eliminates the magnetic influence on the second magnetic underlayer 43 via the non-magnetic layer 42 and thereby avoids disturbance on the perpendicular magnetic anisotropy of the second magnetic underlayer 34, causing no influence on the perpendicular magnetic anisotropy of the data recording layer 10 formed as a Co/Ni film stack. This allows providing improved fcc (111) orientation for the data recording layer 10 formed as a Co/Ni film stack.

On the contrary, the use of a NiFeW film with a film thickness more than 3 nm as the first magnetic underlayer 41 is unpreferable, since the use of such NiFeW film undesirably weakens the perpendicular magnetic anisotropy of the data recording layer 10 due to the magnetic influence on the second magnetic underlayer 43 and the data recording layer 10 via the non-magnetic underlayer 42.

Furthermore, the use of a NiFeW film with a film thickness less than 0.5 nm as the first magnetic underlayer 41 undesirably deteriorates the fcc (111) orientation of the data recording layer 10, since the surface unevenness of the interlayer dielectric 60 influences the non-magnetic under layer 42 via the first magnetic underlayer 41. As is understood from the above-described discussion, the preferred thickness range of the NiFeW film for the first magnetic underlayer 41 is 0.5 to 3 nm.

Figure 4B:
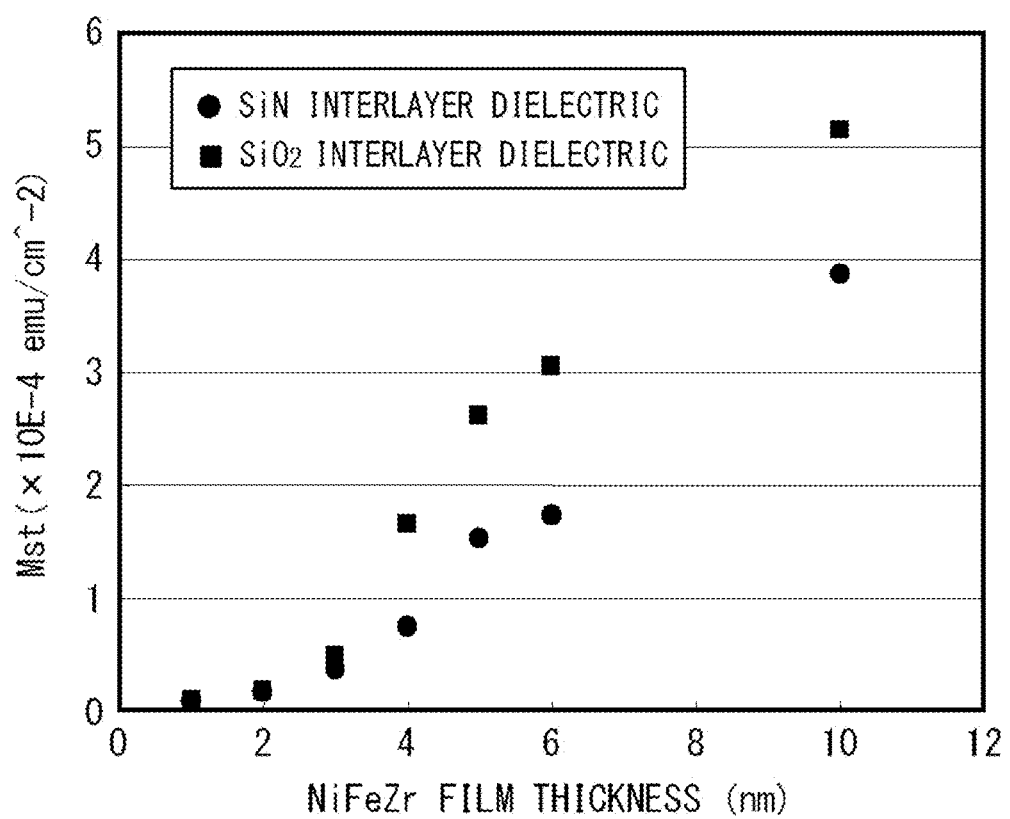
FIG. 4B is a graph showing the change in the magnitude of the magnetization of a NiFeZr film against the film thickness.
Figure 4C:
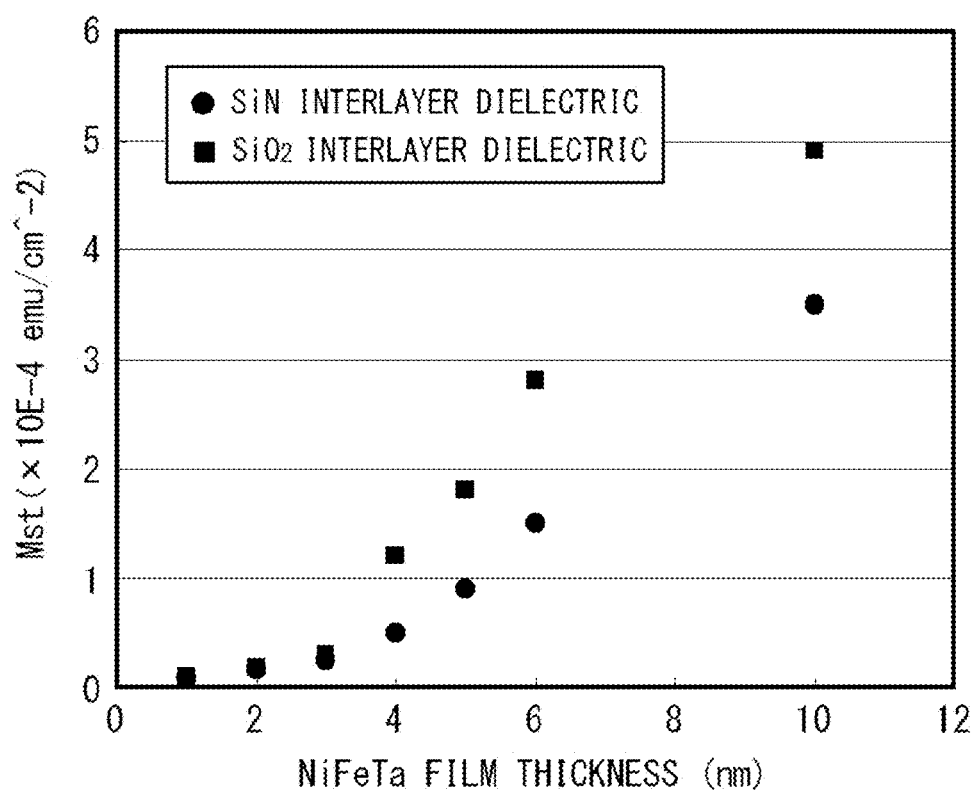
FIG. 4C is a graph showing the change in the magnitude of the magnetization of a NiFeTa film against the film thickness.

The same applies to a case where at least one non-magnetic element selected from the group consisting of Zr, Ta, Hf and V is doped to NiFe base metal in place of W. For example, FIG. 4B is a graph showing the change in the magnitude of the magnetization of the NiFeZr film against the film thickness, and FIG. 4C is a graph showing the change in the magnitude of the magnetization of the NiFeTa film against the film thickness. It should be noted that FIGS. 4B and 4C were obtained by depositing NiFeZr films and NiFeTa films on substrates which incorporate a SiN film formed on a Si substrate and measuring the magnetizations of the NiFeZr films and the NiFeTa films. Also for the NiFeZr and NiFeTa films, considerably reduced magnetizations were observed in a film thickness range of 0.5 nm to 3 nm, especially less than 2 nm. This result indicates that NiFeZr and NiFeTa films do not exhibit magnetization with a thin film thickness, when the NiFeW and NiFeTa films are deposited on the interlayer dielectric 60.

As is understood from the above-described discussion, the first magnetic underlayer 41 preferably has a film thickness from 0.5 nm to 3 nm, more preferably, less than 2 nm.

Experiment 2

Crystalline Structure of First Magnetic Underlayer 41

Next, a description is given of experimental results concerning the relation between the non-magnetic dopant concentration and the crystalline structure of the first magnetic underlayer 41, which includes NiFe as the major constitute and at least one non-magnetic element selected from the group consisting of Zr, Ta, W, Hf and V. Formed in this experiment were films composed of NiFe base metal doped with any of Zr, Ta, W, Hf and V. The crystalline structures of the formed films were analyzed by using an X-ray diffractometer. The composition of the NiFe base metal, which is the major constituent, was Ni:Fe=77.5:22.5. The thickness of the formed films was 15 nm.

The results showed that the NiFeX films (X: Zr, Ta, W, Hf or V), which were doped with at least one non-magnetic element selected from the group consisting of Zr, Ta, W, Hf and V, exhibited diffraction profiles with broad peaks for non-magnetic dopant concentrations of 10 to 25 atomic %; this indicates that the NiFeX films has an amorphous structure. For non-magnetic dopant concentrations less than 10 atomic %, a crystalline structure resulting from NiFe was observed. For non-magnetic dopant concentrations more than 25 atomic %, diffraction peaks of compounds and mixtures of NiFe and the non-magnetic element were observed. This suggests that the preferred concentration of the non-magnetic element is 10 to 25 atomic %, when a NiFeX film (X: Zr, Ta, W, Hf and V), which is doped with at least one non-magnetic element selected from the group consisting of Zr, Ta, W, Hf and V, is used as the first magnetic underlayer 41.

As described above, the first magnetic underlayer 41, which includes NiFe as the major constituent and at least one non-magnetic element selected from the group consisting of Zr, Ta, W, Hf and V, exhibits substantially no magnetization when the film thickness of the first magnetic underlayer 41 is adjusted to 0.5 to 3 nm. The dopant concentration of the non-magnetic element (Zr, Ta, W, Hf or V) preferably ranges from 10 to 25 atomic %.

Experiment 3

Magnetic Coupling between Data Recording Layer 10 and Magnetization Fixed Layers 50*a* and 50*b*

Next, a description is given of experimental results concerning the relation between the thickness of the non-magnetic underlayer 42 and the magnitude of the magnetic coupling between the data recording layer 10 and the magnetization fixed layers 50*a* and 50*b*. In this experiment, film stacks were formed each of which includes films corresponding to the magnetization fixed layers 50*a*, 50*b*, the first magnetic underlayer 41, the non-magnetic underlayer 42, the second magnetic underlayer 43 and the data recording layer 10. Co/Pt film stacks, in which Co and Pt films are alternately layered, were used as the magnetic films corresponding to the magnetization fixed layers 50*a* and 50*b*. NiFeZr films of a thickness of 1.5 nm were used as the films corresponding to the first magnetic underlayer 41, and Pt films were used as the films corresponding to the non-magnetic underlayer 42. Co/Pt film stacks in which multiple Co films of a thickness of 0.4 nm and multiple Pt films of a thickness of 0.8 nm were alternately layered were used as the films corresponding to the second magnetic underlayer 43. Finally, Co/Ni film stacks in which five Co films of a thickness of 0.3 nm and five Ni films of a thickness of 0.6 nm were alternately layered were used as the films corresponding to the data recording layer 10. Samples of the above-described structures in which the Pt films corresponding to the non-magnetic layer 42 have different thicknesses in the range of 0.3 to 5 nm were prepared, and the magnetic properties thereof were measured. All of the prepared samples were previously subjected to annealing at 350° C. for two hours in vacuum.

FIG. 5A is a table showing the change in the coupling magnetic field exerted via the Pt film (which corresponds to the non-magnetic underlayer 42) against the film thickness of the Pt film. As shown in FIG. 5A, coupling magnetic fields of 1900 to 1975 (Oe) were observed across the Pt film corresponding to the non-magnetic underlayer 42 in a film thickness range of 0.5 to 4.0 nm. The inventors consider that this result arises from the following reason: Since the Co/Pt film stack corresponding to the magnetization fixed layers 50*a* and 50*b* functions as an underlayer of the NiFeZr film corresponding to the first magnetic underlayer 41, the thin NiFeZr film exhibits perpendicular magnetic anisotropy due to the influence of the magnetization of the Co/Pt film stack. Furthermore, the perpendicular magnetizations of the Co/Pt film stack and the NiFeZr film have an influence on the Co/Pt film stack corresponding to the second magnetic underlayer 43 via the Pt film corresponding to the non-magnetic underlayer 42, resulting in a magnetic coupling for reduced thicknesses of the Pt film. Furthermore, the Co/Pt film stack corresponding to the second magnetic underlayer 43 is magnetically coupled to the Co/Ni film stack corresponding to the data recording layer 10. As a result, a coupling magnetic field of about 1900 to 1975 (Oe) is generated via the Pt film corresponding to the non-magnetic underlayer 42. This implies that the magnetizations of the magnetization fixed regions 11*a* and 11*b* of the data recording layer 10 can be fixed by the magnetic coupling between the magnetization fixed layers 50*a*, 50*b* and the data recording layer 10.

For the film thicknesses of 4.5 nm or more, on the other hand, the coupling magnetic field exerted via the Pt film corresponding to the non-magnetic underlayer 42 was zero. This implies that the use of a Pt film of a thickness of 4.5 nm or more as the non-magnetic underlayer 42 results in that the magnetizations of the magnetization fixed layers 50*a* and 50*b* and the data recording layer 10 are not magnetically coupled, that is, the magnetizations of the magnetization fixed regions 11*a* and 11*b* of the data recording layer 10 are not fixed.

It should be noted that the coupling magnetic field is relatively small when the thickness of the Pt film corresponding to the non-magnetic underlayer 42 is as thin as 0.3 nm, although the Co/Pt film stack corresponding to the magnetization fixed layers 50a and 50b is magnetically coupled to the Co/Ni film stack corresponding to the data recording layer 10. This is because the Pt film does not exhibit a sufficient fcc (111) orientation, and therefore the Co/Ni film stack deposited thereon also exhibits a poor fcc (111) orientation. As is understood from the above-described discussion, when a Pt film is used as the non-magnetic underlayer 42, the Pt film preferably has a film thickness of 0.5 to 4.0 nm.

Similar results were obtained for a case where any of a Au film, a Pd film and an Ir film is used instead of the Pt film. For example, FIG. 5B is a table showing the change in the coupling magnetic field exerted via a Pd film against the film thickness of the Pd film, when a NiFeTa film of a thickness of 1.5 nm is used as the film corresponding to the first magnetic underlayer 41, and the Pd film is used as the film corresponding to the non-magnetic underlayer 42. As shown in FIG. 5B, a coupling magnetic field of 1910 to 1975 (Oe) was observed via the Pd film corresponding to the non-magnetic underlayer 42 for film thicknesses of 0.5 to 4.0 nm. When the film thickness of the Pd film corresponding to the non-magnetic underlayer 42 is 4.5 nm or more, the coupling magnetic field was zero or a value close to zero. Also, when the film thickness of the Pd film corresponding to the non-magnetic under layer 42 was as thin as 0.3 nm, a relatively reduced coupling magnetic field of 1630 (Oe) was observed.

Furthermore, FIG. 5C is a table showing the change in the coupling magnetic field exerted via an Ir film against the film thickness of the Ir film, when a NiFeTa film of a thickness of 1.5 nm is used as the film corresponding to the first magnetic underlayer 41, and the Ir film is used as the film corresponding to the non-magnetic underlayer 42. As shown in FIG. 5C, a coupling magnetic field of 1930 to 1965 (Oe) was observed via the Ir film corresponding to the non-magnetic underlayer 42 for film thicknesses of 0.5 to 4.0 nm. When the film thickness of the Ir film corresponding to the non-magnetic underlayer 42 is 4.5 nm or more, the coupling magnetic field was zero. Also, when the film thickness of the Ir film corresponding to the non-magnetic under layer 42 was as thin as 0.3 nm, a relatively reduced coupling magnetic field of 1700 (Oe) was observed.

The above-described results indicate that the non-magnetic underlayer 42 preferably has a thickness of 0.5 to 4.0 nm.

Experiment 4

Magnetic Property of Magnetoresistance Effect Element 100

In the following, a description is given of experimental results concerning the magnetic property of the magnetoresistance effect element 100 to which the above-described underlayer 40 is applied. In this experiment, magnetoresistance effect elements 100 to which the above-described underlayer 40 is applied were actually manufactured and magnetic properties of the data recording layers 10 were measured.

Magnetoresistance effect elements 100 of the following structures were prepared as embodiment examples 1. A first magnetic underlayer 41, a non-magnetic underlayer 42 and a second magnetic underlayer 43 were sequentially layered in this order as the underlayer 40 of each magnetoresistance effect element 100. A NiFeZr film of a thickness of 1.5 nm was used as the first magnetic underlayer 41, and a Pt film of a thickness of 2 nm was used as the non-magnetic underlayer 42. A magnetic film stack in which multiple Co films of a thickness of 0.4 nm and multiple Pt films of a thickness of 0.8 nm were alternately layered was used as the second magnetic underlayer 43. A Co/Ni film stack in which five Co films of a thickness of 0.3 nm and five Ni films of a thickness of 0.6 nm were alternately layered was used as the data recording layer 10. The magnetoresistance effect elements 100 of the above-described structure were prepared, wherein the number of the Co and Pt films in the second magnetic underlayer 43 was varied from zero to four. The width of the magnetoresistance effect elements 100 was 100 nm. These magnetoresistance effect elements 100 were subjected to annealing at 350° C. for two hours in vacuum, after the underlayer 40 and the data recording layer 10 were formed.

Figure 6A:
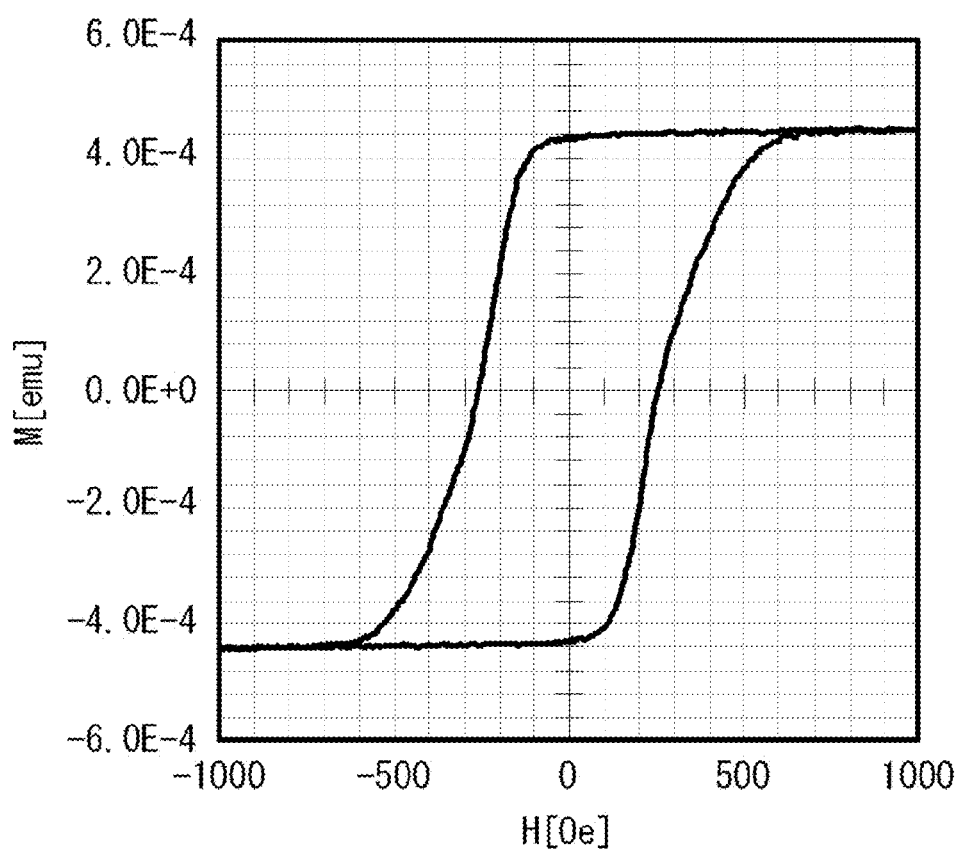
FIG. 6A is a graph showing the magnetization-field curve of a data recording layer in embodiment example 1 of the first embodiment for a case where a second magnetic underlayer is not provided.
Figure 6B:
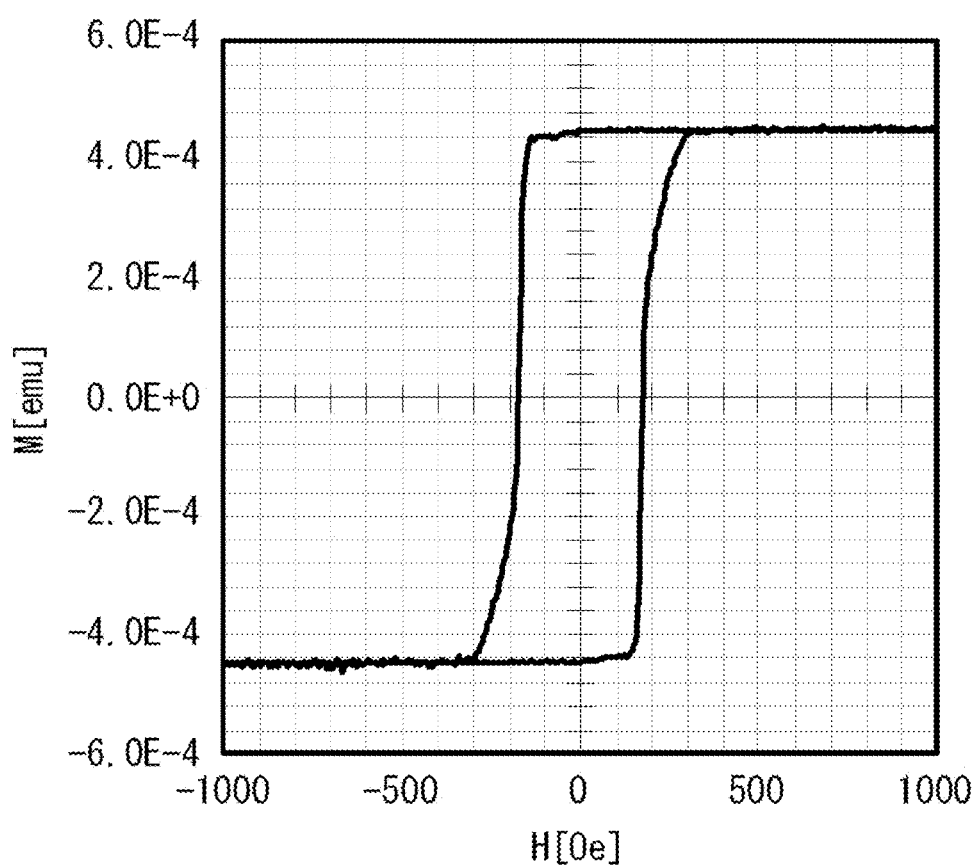
FIG. 6B is a graph showing the magnetization-field curve of a data recording layer in embodiment example 1 of the first embodiment for a case where one Co film and one Pt film are layered in a second magnetic underlayer.
Figure 6C:
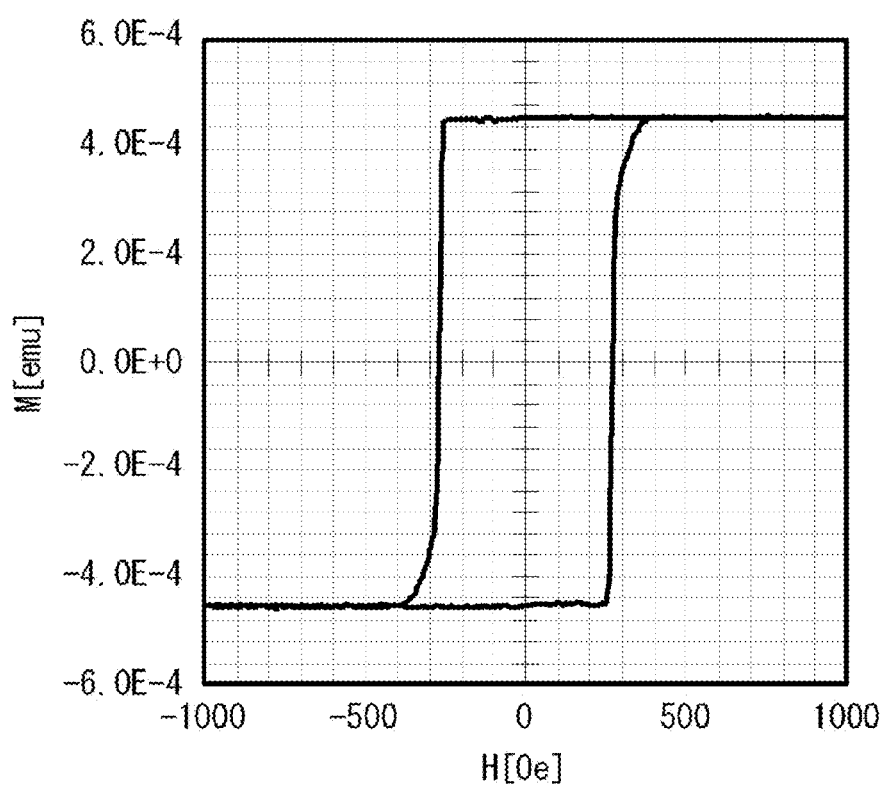
FIG. 6C is a graph showing the magnetization-field curve of a data recording layer in embodiment example 1 of the first embodiment for a case where two Co film and two Pt film are layered in a second magnetic underlayer.
Figure 6D:
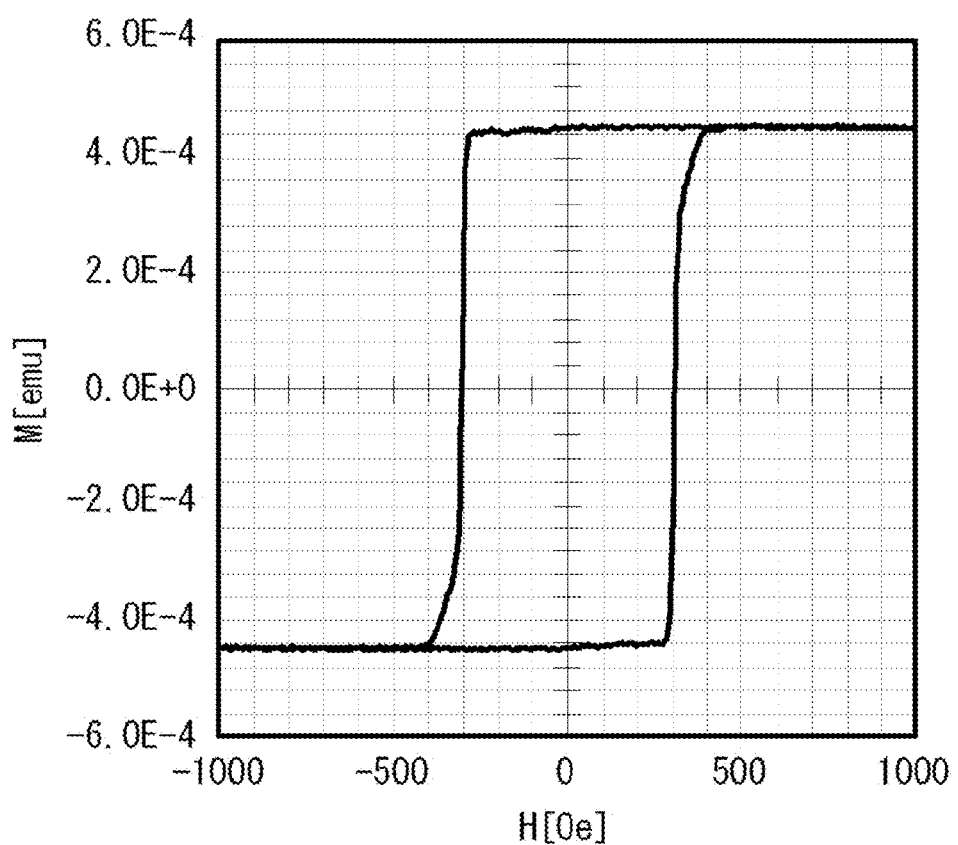
FIG. 6D is a graph showing the magnetization-field curve of a data recording layer in embodiment example 1 of the first embodiment for a case where three Co film and three Pt film are layered in a second magnetic underlayer.

FIGS. 6A to 6D are diagrams showing the magnetization-field curves of the data recording layers 10 for cases where the number of the Co and Pt films within the second magnetic underlayer 43 was zero to three. For the case where the number of the Co and Pt films was zero (that is, the case where the second magnetic underlayer 43 was not provided), as shown in FIG. 6A, the data recording layer 10 exhibited relatively weak perpendicular magnetic anisotropy, incorporating an in-plane magnetization component. As shown in FIGS. 6B to 6D, there was a tendency in which the M-H loops became more rectangular and the perpendicular magnetic anisotropy was enhanced as the number of the layered Co and Pt films was increased. This implies that the use of the second magnetic underlayer 43 enables achieving strong perpendicular magnetic anisotropy for the case where a Co/Ni film stack, for which it is relatively difficult to achieve the fcc (111) orientation, is used as the data recording layer 10, even after the annealing at 350° C. for two hours.

Figure 6E:
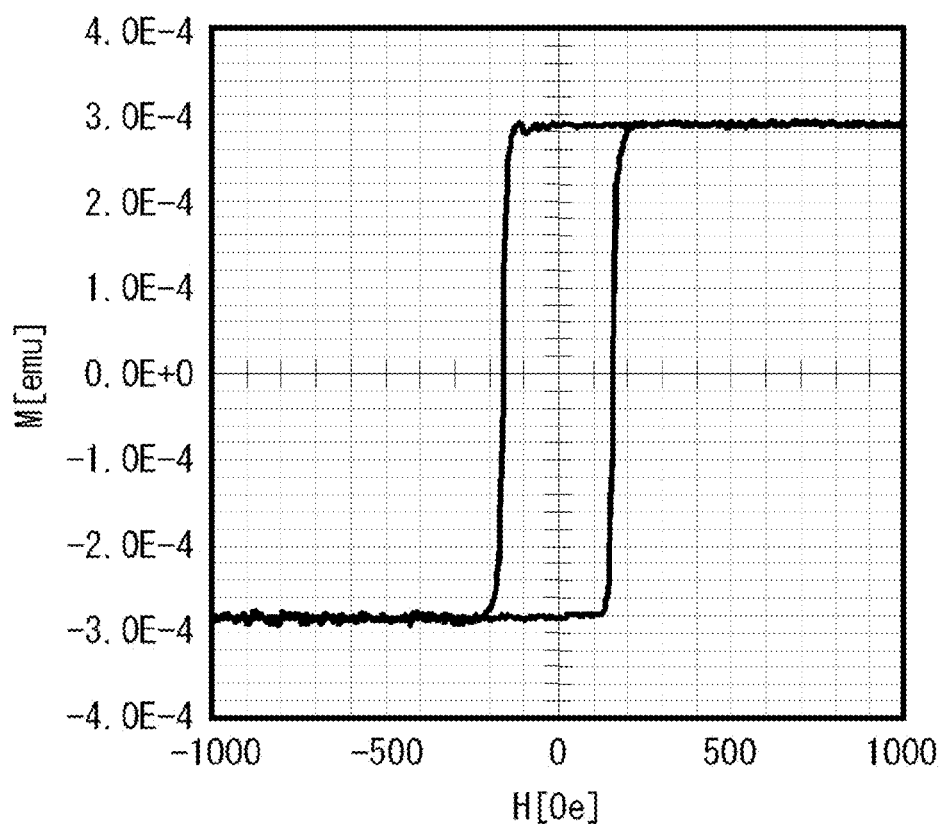
FIG. 6E is a graph showing the magnetization-field curve of a Co/Pt film stack formed on a Pt film corresponding to a non-magnetic underlayer.

A similar measurement was done for a case where a NiFeZr film of a thickness of 1.5 nm and a Pt film of a thickness of 2 nm were used as the first magnetic underlayer 41 and the non-magnetic underlayer 42, respectively, and a Co/Pt magnetic film stack in which a Co film of a thickness of 0.4 nm and a Pt film of a thickness of 0.8 nm was layered was deposited on the non-magnetic underlayer 42. The number of the Co film and the Pt film in the Co/Pt magnetic film stack was one. FIG. 6E is a diagram showing the magnetization-field curve for the case where the Co/Pt magnetic film stack was used. As shown in FIG. 6E, a magnetization-field curve with an improved rectangular shape was obtained for the Co/Pt magnetic film stack, in which fcc (111) orientation is relatively easily formed.

This fact has two technical meanings. First, the use of a Co/Pt magnetic film stack as the data recording layer 10 effectively achieves strong perpendicular anisotropy for the data recording layer 10. Second, the use of a Co/Pt magnetic film stack as the second magnetic underlayer 43 enables forming the second magnetic underlayer 43 with improved fcc (111) orientation, effectively improving the perpendicular magnetic anisotropy of the data recording layer 10 formed thereon (for example, formed of a Co/Ni magnetic film stack).

Figure 7:
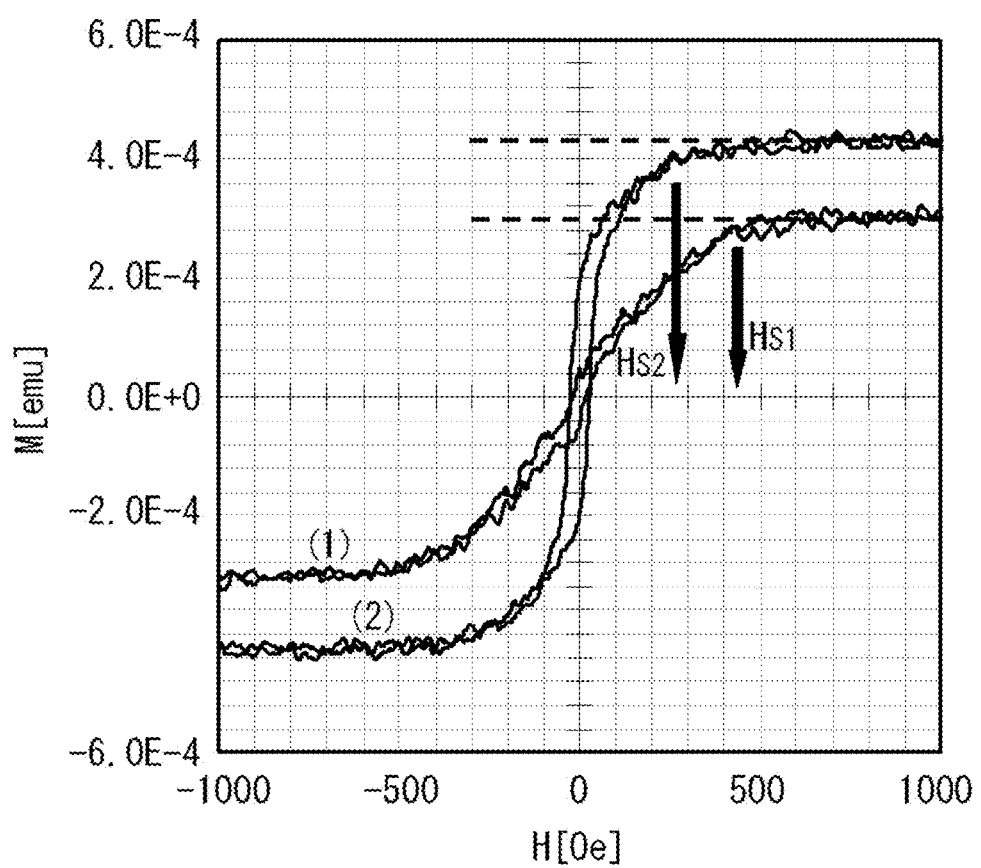
FIG. 7 is a graph showing the definition of the saturation field $H_S$.

Furthermore, the saturation field $H_S$ was measured for a case where a Co/Pt magnetic film stack was used as the second magnetic underlayer 43 and a Co/Ni magnetic film stack was used as the data recording layer 10. FIG. 7 shows the definition of the saturation field $H_S$ in the present application. In the present application, the saturation field $H_S$ is defined as the magnitude of the external magnetic field at which the magnetizations in the data recording layer 10 are completely directed in the direction of the external magnetic field when the external magnetic field is applied in the in-plane direction of the data recording layer 10. In FIG. 7, for example, $H_{S1}$ indicates the saturation field of sample (1) and $H_{S2}$ indicates the saturation field of sample (2). A large saturation field implies that the perpendicular magnetic anisotropy is large. In FIG. 7, for example, the saturation field $H_S$ (that is, the magnetic field which completely directs the magnetizations in the direction thereof) of sample (1) is larger than that of sample (2), and this implies that the perpendicular magnetic anisotropy of sample (1) is larger than that of sample (2).

Figure 8:
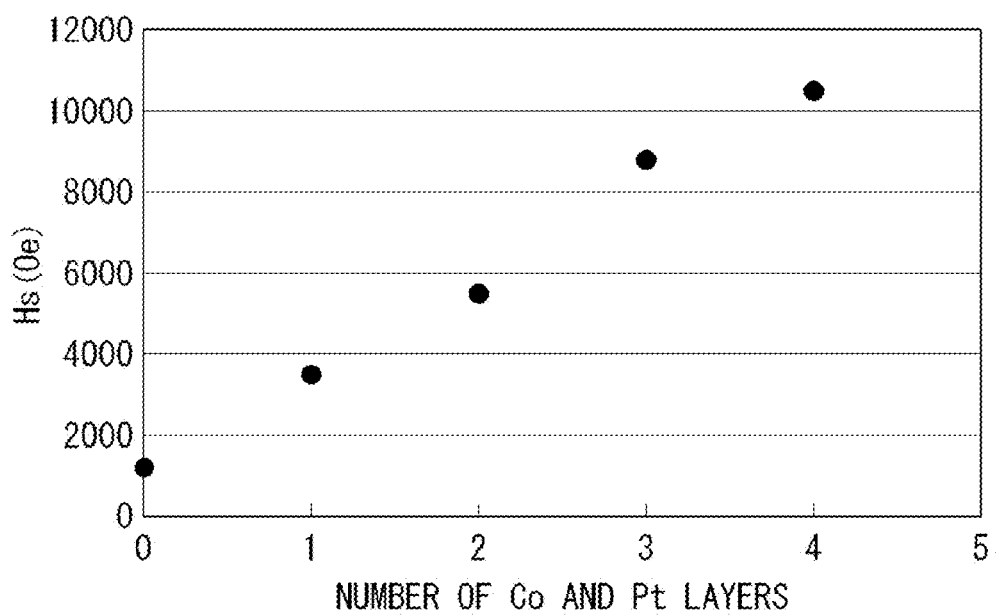
FIG. 8 is a graph showing the change in the saturation field $H_S$ against the number of Co and Pt films in the second magnetic underlayer in embodiment example 1 of the first embodiment.

FIG. 8 shows the change in the saturation field $H_S$ of the data recording layer 10 against the number of the Co and Pt films in the second magnetic underlayer 43, where the number of the Co and Pt films was varied from zero to four. As is understood from FIG. 8, the saturation field $H_S$ was increased as the number of the Co and Pt films in the second magnetic underlayer 43; this implies that the perpendicular magnetic anisotropy was enhanced as the number of the Co and Pt films was increased.

Figure 9:
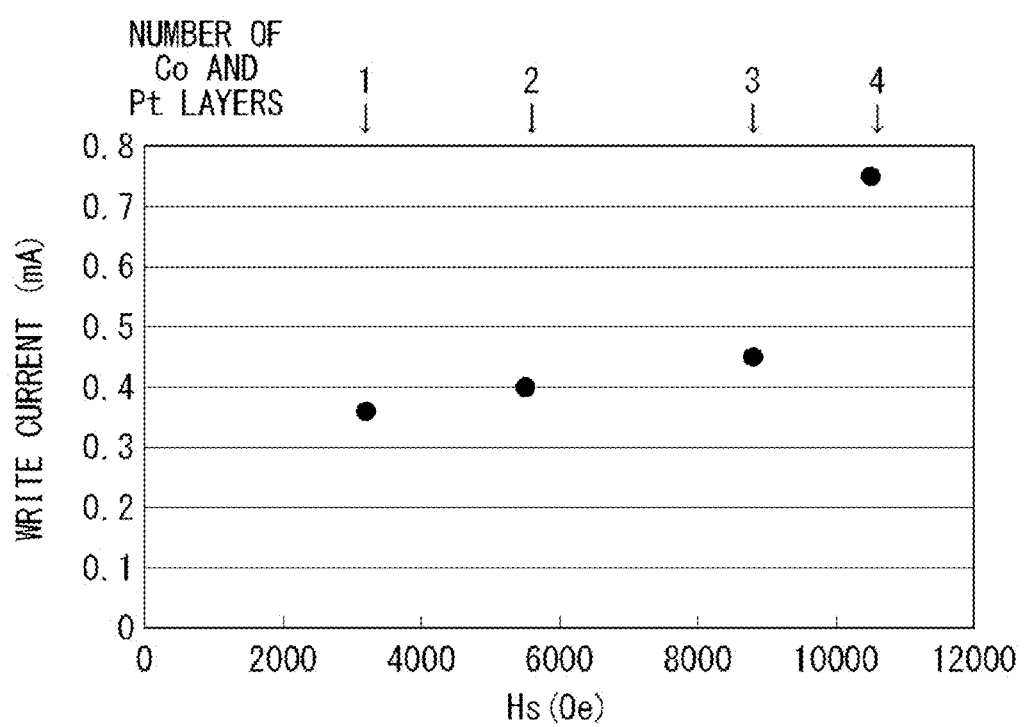
FIG. 9 is a graph showing the relation among the number of the Co and Pt films in the second magnetic underlayer, the saturation field $H_S$ and the write current in embodiment example 1 of the first embodiment.

FIG. 9 shows the changes in the saturation field $H_S$ and the write current against the number of the Co and Pt films in the second magnetic underlayer 43. The magnitude of the write current is defined as the minimum write current necessary for causing domain wall motion in the data recording layer 10. Details of the experimental procedure are also described in T. Suzuki et al., "Evaluation of Scalability for Current-Driven Domain Wall Motion in a Co/Ni Multilayer Strip for Memory Applications", IEEE TRANSACTIONS ON MAGNETICS, VOL. 45, No. 10, pp. 3776-3779, (2009), the disclosure of which is incorporated herein by reference.

For samples in which the number of the Co and Pt films in the second magnetic underlayer 43 was zero (this implies that the second magnetic underlayer 43 was not deposited), domain wall motion by the current was not observed clearly, resulting in an unsuccessful measurement of the write current. This can be considered as resulting from that the data recording layer 10 exhibited relatively weak perpendicular magnetic anisotropy and incorporated in-plane magnetization components as shown in FIG. 6A.

For cases where the number of the Co and Pt films in the second magnetic underlayer 43 was not zero, the write current was gradually increased as the number of the Co and Pt films was increased. For the case where the number of the Co and Pt films was four, the saturation field $H_S$ was increased up to about 10000 (Oe) and the write current was steeply increased to exceed 0.5 mA. According to N. Sakimura et al., "MRAM Cell Technology for Over 500-MHz SoC", IEEE JOURNAL OF SOLID-STATE CIRCUITS, VOL. 42, No. 4, pp. 830-838, 2007, the cell area can be reduced to the level of existing embedded SRAMs by reducing the write current below 0.5 mA.

As thus described, the use of a Co/Pt film stack as the second magnetic underlayer 43 effectively enhanced the perpendicular magnetic anisotropy of the data recording layer 10, when a Co/Ni film stack was used as the data recording layer 10. In addition, the adjustment of the number of the Co and Pt films in the second magnetic underlayer 43 enabled controlling the perpendicular magnetic anisotropy of the data recording layer 10, sufficiently reducing the write current necessary for causing domain wall motion (or the domain wall motion current). The range of the saturation field $H_S$ preferable for adjusting the perpendicular magnetic anisotropy to an appropriate value was 3000 (Oe)≤$H_S$≤10000 (Oe), and the number of the Co and Pt films in the second magnetic underlayer 43 for achieving a saturation field $H_S$ in this range was one to three.

Figure 10:
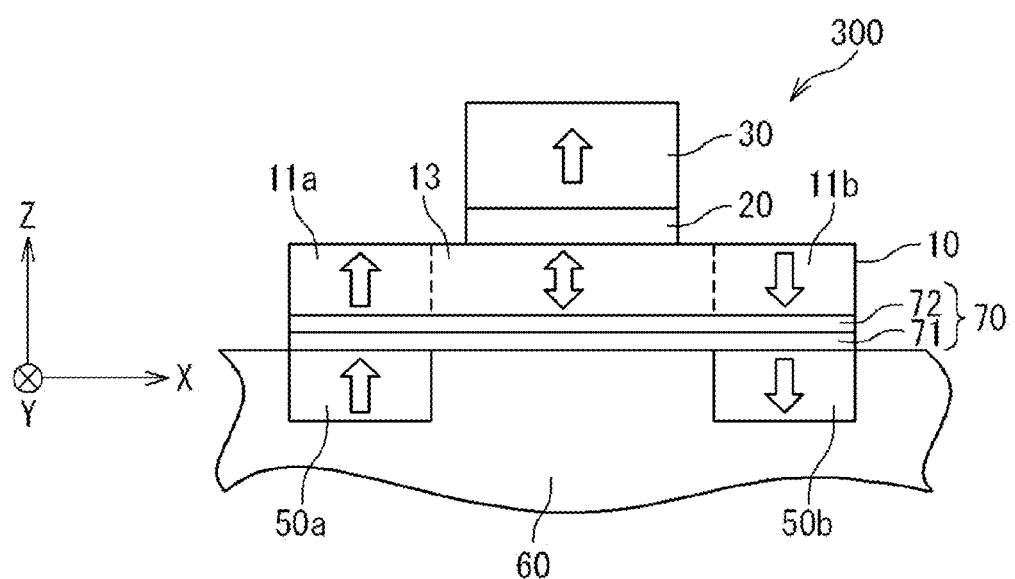
FIG. 10 is a section view showing the structure of comparative example 1 of the first embodiment.

As comparative example 1, a magnetoresistance effect element 300 was further prepared as shown in FIG. 10, in which an underlayer 70 was composed of a first magnetic underlayer 71 and a non-magnetic underlayer 72, where a NiFeB film of a thickness of 2 nm was used as the first magnetic underlayer 71, and a Pt film of a thickness of 2 nm was used as the non-magnetic underlayer 72. Formed on the underlayer 70 was a data recording layer 10 formed as a Co/Ni film stack in which five Co films of a thickness of 0.3 nm and five Ni films of a thickness of 0.6 nm were alternately layered. The magnetoresistance effect element 300 was subjected to annealing at 350° C. for two hours in vacuum after the underlayer 70 and the data recording layer 10 were formed, as is the case with embodiment example 1.

The saturation field $H_S$ of the data recording layer 10 of the magnetoresistance effect element 300 was measured as about 1050 (Oe). Also, it was determined from the magnetization-field loop measured by applying a magnetic field in the perpendicular direction of the film surface that the data recording layer 10 of the magnetoresistance effect element 300 incorporated in-plane magnetization components and exhibited very weak perpendicular magnetic anisotropy. The NiFeB film exhibits in-plane magnetic anisotropy regardless of the film thickness and the magnetization thereof is increased by thermal annealing. This may be because the first magnetic underlayer 71 caused an effect of directing the magnetization of the data recording layer 10 (Co/Ni film stack) in the in-plane direction via the non-magnetic underlayer 72, resulting in that the data recording layer 10 was formed as an in-plane magnetization film which exhibited weak perpendicular magnetic anisotropy.

Figure 11A:
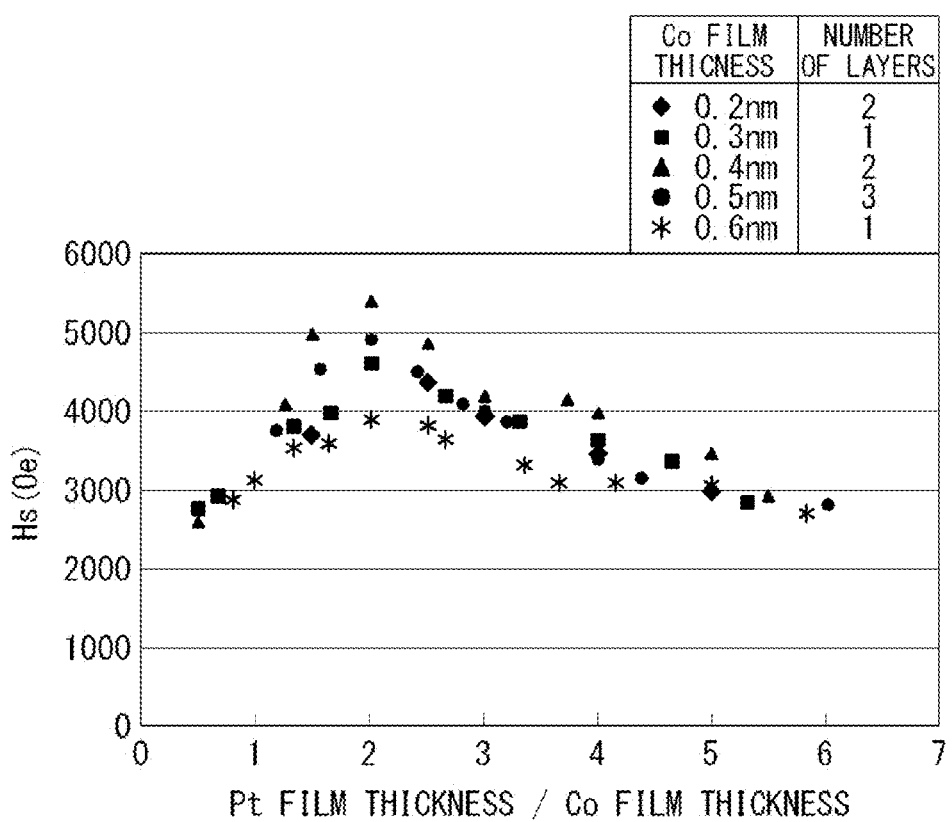
FIG. 11A is a graph showing the relation between the thickness ratio of the Co and Pt films in the second magnetic underlayer and the saturation field $H_S$ in embodiment example 1 of the first embodiment, where a NiFeW film is used as a first magnetic underlayer and a Pt film is used as a non-magnetic underlayer.

Furthermore, as embodiment examples 2, magnetoresistance effect elements 100 in which a NiFeW film of a thickness of 1.5 nm was used as the first magnetic underlayer 41 were additionally prepared. Except for this aspect, the configuration of the magnetoresistance effect elements 100 of embodiment examples 2 was the same as that of embodiment examples 1. In detail, the first magnetic underlayer 41, the non-magnetic underlayer 42 and the second magnetic underlayer 43 were serially formed in this order as the underlayer 40. A NiFeW film of a thickness of 1.5 nm was used as the first magnetic underlayer 41, and a Pt film of a thickness of 2 nm was used as the non-magnetic underlayer 42. A magnetic film stack in which multiple Co films and multiple Pt films were alternately layered was used as the second magnetic underlayer 43. A Co/Ni film stack in which five Co films of a thickness of 0.3 nm and five Ni films of a thickness of 0.6 nm were alternately layered was used as the data recording layer 10. The magnetoresistance effect elements 100 of embodiment examples 2 were also subjected to annealing at 350° C. for two hours in vacuum. For the magnetoresistance effect elements 100 thus structured, the change in the magnetization field $H_S$ was examined against the film thickness ratio of the Pt and Co films in the second magnetic underlayer 43 and the number of the Pt and Co films. FIG. 11A is a graph showing the change in the magnetization field $H_S$ against the number of the Pt and Co films of the second magnetic underlayer 43 for different film thickness ratios of the Pt and Co films. As is understood from FIG. 11A, for a case where the film thickness ratio of the Pt films to the Co films in the second magnetic underlayer 43 was 1.0 to 5.0, the saturation field $H_S$ ranged from 3000 to 5500 (Oe) when the number of the Co films and Pt films was one to three; this implies that the data recording layer 10 exhibited such perpendicular magnetic anisotropy that current-driven domain wall motion could be achieved.

Figure 11B:
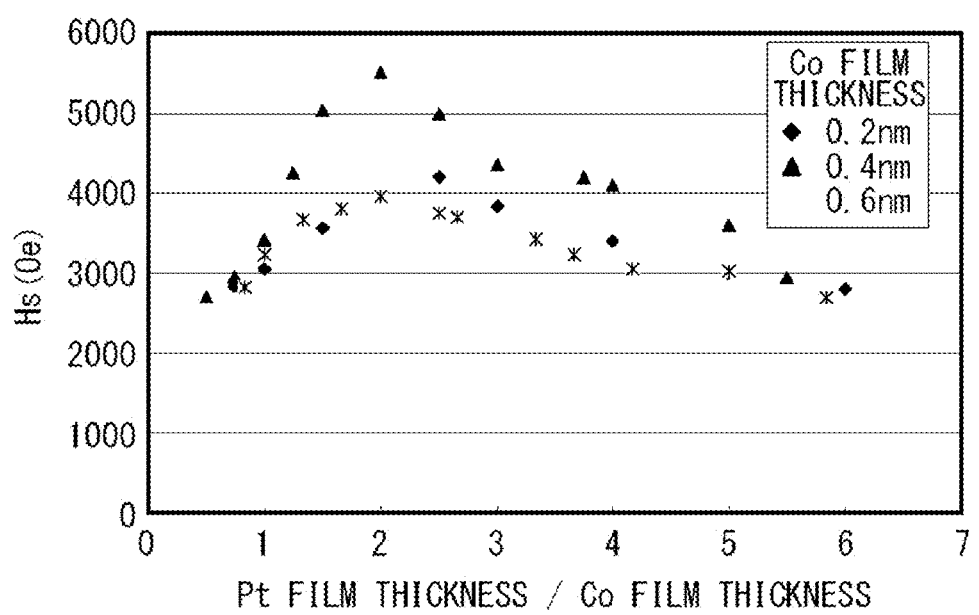
FIG. 11B is a graph showing the relation between the thickness ratio of the Co and Pt films in the second magnetic underlayer and the saturation field $H_S$ in embodiment example 1 of the first embodiment, where a NiFeV film is used as a first magnetic underlayer and a Au film is used as a non-magnetic underlayer.

Furthermore, as examples 3, magnetoresistance effect elements 100 in which a NiFeV film of a thickness of 1.5 nm was used as the first magnetic underlayer 41 and a Au film of a thickness of 2 nm was were additionally prepared. Except for this aspect, the configuration of the magnetoresistance effect elements 100 of examples 3 was the same as those of embodiment examples 1 and 2. For the magnetoresistance effect elements 100 thus structured, the change in the magnetization field $H_S$ was examined against the film thickness ratio of the Pt and Co films in the second magnetic underlayer 43 and the number of the Pt and Co films. FIG. 11B is a graph showing the change in the magnetization field $H_S$ against the number of the Pt and Co films of the second magnetic underlayer 43 for different film thickness ratios of the Pt and Co films. Also in FIG. 11B, the saturation field $H_S$ ranged from 3000 to 5500 (Oe) for a case where the film thickness ratio of the Pt films to the Co films in the second magnetic underlayer 43 was 1.0 to 5.0; this implies that the data recording layer 10 exhibited such perpendicular magnetic anisotropy that current-driven domain wall motion could be achieved.

The above-described results indicate that the preferred film thickness ratio of the Co films and Pt films in the second magnetic underlayer 43 is 1.0 to 5.0.

Although the above-described examples are related to the cases where a NiFeZr film or NiFeW film was used as the first magnetic underlayer 41, a Pt film was used as the non-magnetic underlayer 42, and a film stack composed of Co and Pt films was used as the second non-magnetic underlayer 43, the materials of the first magnetic underlayer 41, the non-magnetic underlayer 42 and the second magnetic underlayer 43 are not limited to those described above. The inventors have confirmed that the similar effect can be achieved by using thin film material obtained by doping base metal of NiFe with at least one non-magnetic material selected from the group of Ta, Hf and V (in place of Zr and W). Also, the inventors have confirmed that the similar effect can be achieved by using a Au film, a Pd film or an Ir film as the non-magnetic underlayer 42 in place of the Pt film. Furthermore, the inventors have confirmed that the similar effect can be achieved by using a combination of layers formed of any one of Pt and Pd and layers formed of any one of Fe, Co and Ni as the second magnetic underlayer 43, in place of the combination of Co films and Pt films.

Second Embodiment

Figure 12:
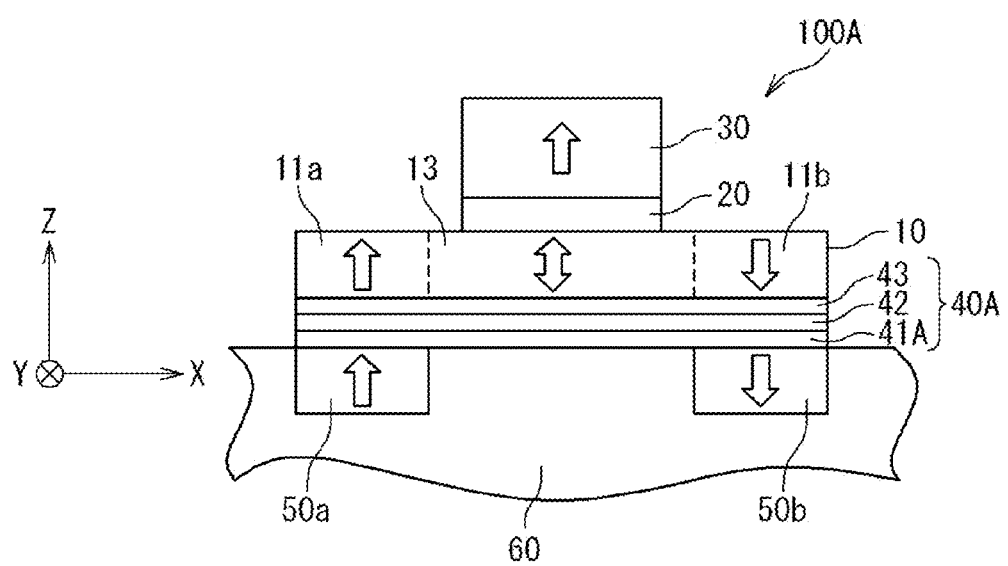
FIG. 12 is a section view schematically showing an exemplary configuration of a magnetoresistance effect element of a second embodiment of the present invention.

FIG. 12 is a section view showing an exemplary structure of a magnetoresistance effect element 100A of a second embodiment of the present invention. The magnetoresistance effect element 100A of the second embodiment is structured similarly to the magnetoresistance effect element 100 of the first embodiment. The difference exists in the structure of the underlayer. In the first embodiment, as described above, the first magnetic underlayer 41 in the underlayer 40 is formed of material which is intrinsically ferromagnetic with such a thin thickness that the first magnetic underlayer 41 does not exhibit ferromagnetism. In the second embodiment, on the other hand, a first magnetic underlayer 41A in an underlayer 40A is formed of material which intrinsically exhibits in-plane magnetic anisotropy, but with such a thin thickness (specifically, 0.5 to 3 nm) that the first magnetic underlayer 41A exhibits perpendicular magnetic anisotropy. The first magnetic underlayer 41A is formed of amorphous magnetic material which includes Co or Fe as the major constituent and at least one non-magnetic element selected from the group consisting of Zr, Ta, W, Hf and V.

The structures of the non-magnetic underlayer 42, the second magnetic underlayer 43 and the data recording layer 10 are the same as those in the first embodiment. The non-magnetic underlayer 42 is formed of a non-magnetic film which has an fcc structure and exhibits strong (111) orientation. In this embodiment, the non-magnetic underlayer 42 is formed of Pt, Au, Pd or Ir and has a thickness of 0.3 to 4.0 nm. The second magnetic underlayer 43 is formed of a magnetic film stack in which at least one first layer and at least one second layer are alternatively layered, where the first layer is formed of any one of Pt and Pd and the second layer is formed of any one of Fe, Co and Ni. The data recording layer 10, which is a magnetic film with perpendicular magnetic anisotropy, is preferably formed of an alternately-layered film stack of transition metals, such as Co/Ni, Co/Pt, Co/Pd, CoFe/Ni, CoFe/Pt and CoFe/Pd. It is known in the art that the saturation magnetizations of these materials are relatively small. More generally speaking, the data recording layer 10 is structures as a film stack in which first and second layers are layered. The first layers include Fe, Co, Ni or alloy of multiple materials selected from the group consisting of Fe, Co and Ni. The second layers include Pt, Pd, Au, Ag, Ni, Cu or alloy of multiple materials selected from the group consisting of Pt, Pd, Au, Ag, Ni and Cu. Among the above-described film stack, the Co/Ni film stack exhibits high spin polarizability. Therefore, a Co/Ni film stack is especially preferable as the data recording layer 10.

An advantage of the first magnetic underlayer 41A of the second embodiment is discussed in the following. As is the case with the first magnetic underlayer 41 of the first embodiment, when formed on an amorphous film like the interlayer dielectric 60, the first magnetic underlayer 41A is grown as being amorphous in a thin film thickness range of 0.5 to 3.0 nm, enlarging the surface energy thereof. The first magnetic underlayer 41A thus structured promotes the closest packed orientation (the orientation with the minimum surface energy face) of the crystalline formed thereon. Furthermore, the non-magnetic underlayer 42 formed on the first magnetic underlayer 41A is grown so that the closest packed face thereof is oriented to face the fcc (111) face, since the non-magnetic underlayer 42 is formed of any of Pt, Au, Pd and Ir, and a film formed of any of these materials originally has the fcc structure. The data recording layer 10 can be formed with a strong perpendicular magnetic anisotropy by forming a magnetic film over the non-magnetic underlayer 42, wherein the magnetic film has an fcc structure and exhibits a strong perpendicular magnetic anisotropy for the (111) orientation. It should be noted that the data recording layer 10 can be formed with a strong perpendicular magnetic anisotropy due to the provision of the first magnetic underlayer 41A, even when the non-magnetic underlayer 42 has a thin film thickness.

Here, the first magnetic underlayer 41A of the second embodiment is formed of material including Co or Fe as the major constituent and at least one non-magnetic element selected from the group consisting of Zr, Ta, W, Hf and V, and such material intrinsically exhibits in-plane magnetic anisotropy. One may consider that this undesirably results in the deterioration of the perpendicular magnetic anisotropy of the data recording layer. Nevertheless, the first magnetic underlayer 41A of such material is actually formed as an amorphous magnetic body with weak perpendicular magnetic anisotropy when the thickness of the first magnetic underlayer 41A is as thin as 0.5 to 3 nm. As is the case with the first magnetic underlayer 41 of the first embodiment, which is formed so as to exhibit substantially no magnetization, the first magnetic underlayer 41A of the second embodiment does not deteriorate the perpendicular magnetic anisotropy of the data recording layer 10. Therefore, the first magnetic underlayer 41A of the second embodiment is also preferable for achieving strong perpendicular magnetic anisotropy in the data recording layer 10.

The portions of the first magnetic underlayer 41A positioned on the magnetization fixed layers 50a and 50b, on the other hand, effectively enhances the magnetic coupling between the data recording layer 10 and the magnetization fixed layers 50a and 50b. For a case where the magnetization fixed layers 50*a* and 50*b* are formed of hard magnetic material, such as a Co/Pt film stack and a Co—Pt alloy film, when the first magnetic underlayer 41A and the non-magnetic underlayer 42 are subsequently layered over the magnetization fixed layers 50*a* and 50*b*, the magnetizations of the portions of the first magnetic underlayer 41A on the magnetization fixed layers 50*a* and 50*b* are directed in the perpendicular directions which are the same directions of that of the magnetization fixed layers 50*a* and 50*b*, respectively, due to the magnetic interactions from the magnetization fixed layers 50*a* and 50*b*. Such magnetic interactions fix the magnetizations of portions of the data recording layer 10 via the non-magnetic underlayer 42, resulting in that the magnetization fixed regions 11*a* and 11*b* are formed in the data recording layer 10. It should be noted that a strong magnetic coupling is achieved between the data recording layer 10 and the magnetization fixed layers 50*a* and 50*b*, due to the thin film thickness of the non-magnetic underlayer 42 (0.5 to 4.0 nm).

As will be understood from experimental results described layer, the first magnetic underlayer 41A of the second embodiment enhances the perpendicular magnetic anisotropy of the data recording layer 10 more effectively than the first magnetic underlayer 41 of the first embodiment, achieving an increase in the MR ratio of the magnetoresistance effect element. In addition, the first magnetic underlayer 41A of the second embodiment enhances the magnetic coupling between the data recording layer 10 and the magnetization fixed layers 50*a* and 50*b* more effectively than the first magnetic underlayer 41 of the first embodiment. The experimental results are described in the following.

Experiment 1

Dependence of MR Ratio of Magnetic Tunnel Junction on Material of Underlayer

Examined first was the dependence of the MR ratio of the magnetic tunnel junction composed of the data recording layer 10, the spacer layer 20 and the reference layer 30 on the material of the first magnetic underlayer 41 or 41A. For each magnetoresistance effect element, a dielectric film corresponding to the interlayer dielectric 60 was formed on a substrate and the underlayer 40 or 40A, the data recording layer 10, the spacer layer 20, and the reference layer 30 were formed. As the underlayer 40 or 40A, the first magnetic underlayer 41 or 41A, the non-magnetic underlayer 42 and the second magnetic underlayer 43 were serially formed in this order.

A NiFeZr film, a CoTa film, a CoZr film or a FeZr film having a thickness of 1.5 nm was used as the first magnetic underlayer 41 or 41A. The NiFeW film included 12.5 atomic % tungsten (W) and the remainder was NiFe base metal. The ratio of Ni to Fe in the NiFe base metal was Ni:Fe=77.5:22.5. The CoTa film included 20 atomic % tantalum (Ta) and the remainder was Co base metal. The CoZr film included 20 atomic % zirconium (Zr) and the remainder was Co base metal. The FeZr film included 20 atomic % zirconium (Zr) and the remainder was Fe base metal. The NiFeZr film corresponds to the first magnetic underlayer 41 of the first embodiment, and The CoTa film, the CoZr film and the FeZr film correspond to the first magnetic underlayer 41A of the second embodiment.

Furthermore, a Pt film of a thickness of 2 nm was used as the non-magnetic underlayer 42, and a magnetic film stack in which multiple Co films of a thickness of 0.4 nm and multiple Pt films of a thickness of 0.8 nm were alternately layered was used as the second magnetic underlayer 43. A Co/Ni film stack in which five Co films of a thickness of 0.3 nm and five Ni films of a thickness of 0.6 nm were alternately layered was used as the data recording layer 10. The samples thus prepared had a width of 100 nm. These samples were subjected to annealing at 300 to 350° C. for two hours in vacuum, after the underlayer 40 (or 40A), the data recording layer 10, the spacer layer 20 and the reference layer 30 were formed.

Figure 13A:
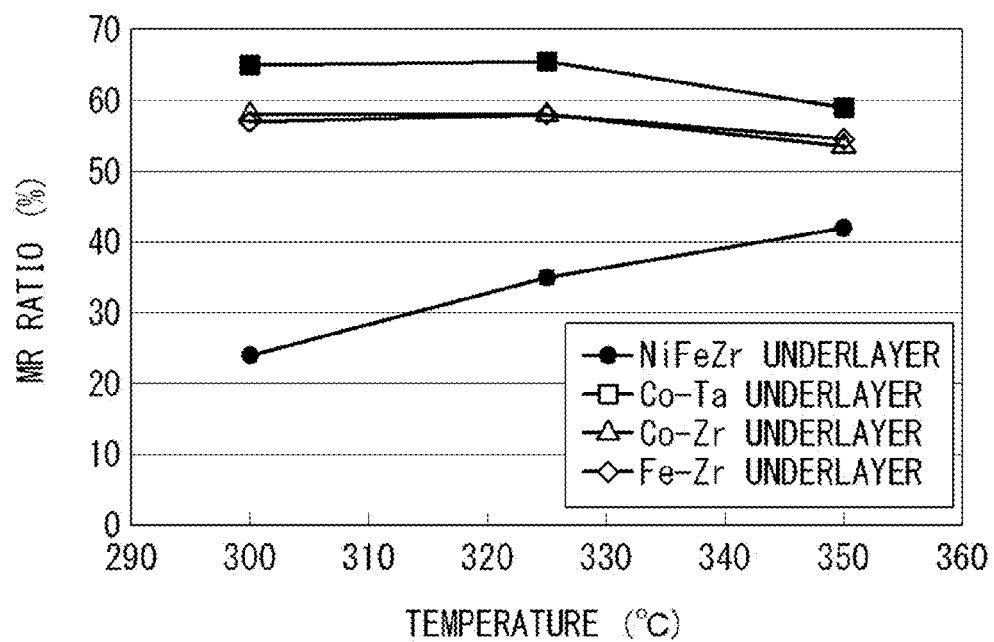
FIG. 13A is a graph showing the dependency of the magnetic tunnel junction on material of a first magnetic underlayer.

FIG. 13A is a graph showing the dependency of the MR ratio on the material of the first magnetic underlayer (41 or 41A). As shown in FIG. 13A, the use of a NiFeZr film (corresponding to the first magnetic underlayer 41 of the first embodiment) resulted in that the magnetic tunnel junctions exhibited MR ratios of about 23 to 42 (it should be noted that MR ratios of this range are sufficient for actual implementations). The use of a CoTa film, a CoZr film or a FeZr film (corresponding to the first magnetic underlayer 41A of the second embodiment), on the other hand, resulted in that the magnetic tunnel junctions exhibited MR ratios of about 53 to 65, achieving higher MR ratios than those achieved by the use of the NiFeZr film. The effect of improvement in the MR ratio was especially significant for cases where the annealing temperature was low (specifically for an annealing temperature of 300° C. This result suggests that the first magnetic underlayer 41A of the second embodiment enhances the perpendicular magnetic anisotropy of the data recording layer 10 more effectively than the first magnetic underlayer 41 of the first embodiment, effectively increasing the MR ratio of the magnetoresistance effect element.

Experiment 2

Evaluation of Coupling State Between Magnetization Fixed Layers 50*a*, 50*b* and Data Recording Layer 10

Furthermore, the coupling state between the magnetization fixed layers 50*a*, 50*b* and the data recording layer 10 was evaluated. A magnetic film corresponding to the magnetization fixed layers 50*a* and 50*b* were formed on a substrate and the underlayer (40 or 40A) and the data recording layer 10 were formed on this magnetic film. As the underlayer 40 or 40A, the first magnetic underlayer 41 or 41A, the non-magnetic underlayer 42 and the second magnetic underlayer 43 were serially formed in this order.

A NiFeZr film or CoTa film of a thickness of 1.5 nm was used as the first magnetic underlayer 41 or 41A. The NiFeZr film corresponds to the first magnetic underlayer 41 of the first embodiment, and the CoTa film corresponds to the first magnetic underlayer 41A of the second embodiment. The NiFeZr film included 12.5 atomic % zirconium (Zr) and the remainder was NiFe base metal. The ratio of Ni to Fe in the NiFe base metal was Ni:Fe=77.5:22.5. The CoTa film included 20 atomic % tantalum (Ta) and the remainder was Co base metal.

Furthermore, a Pt film of a thickness of 2 nm was used as the non-magnetic underlayer 42, and a magnetic film stack in which multiple Co films of a thickness of 0.4 nm and multiple Pt films of a thickness of 0.8 nm were alternately layered was used as the second magnetic underlayer 43. A Co/Ni film stack in which five Co films of a thickness of 0.3 nm and five Ni films of a thickness of 0.6 nm were alternately layered was used as the data recording layer 10. The width of the samples was 100 nm. These samples were subjected to annealing at 300 to 350° C. for two hours in vacuum after the underlayer 40 and the data recording layer 10 were formed.

Figure 13B:
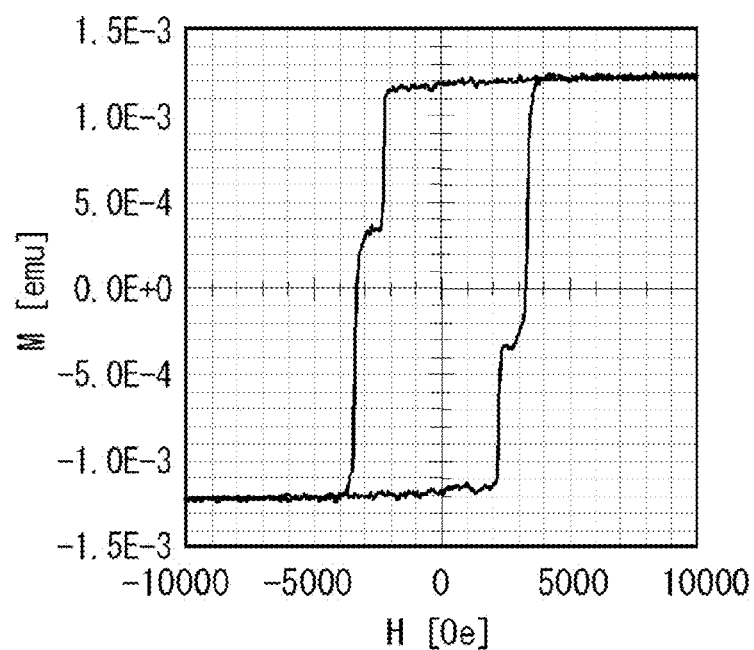
FIG. 13B is a graph showing the magnetization-field curve which indicates the coupling state between a data recording layer and the magnetization fixed layer for a case where the first magnetic underlayer is formed of a NiFeZr film.
Figure 13C:
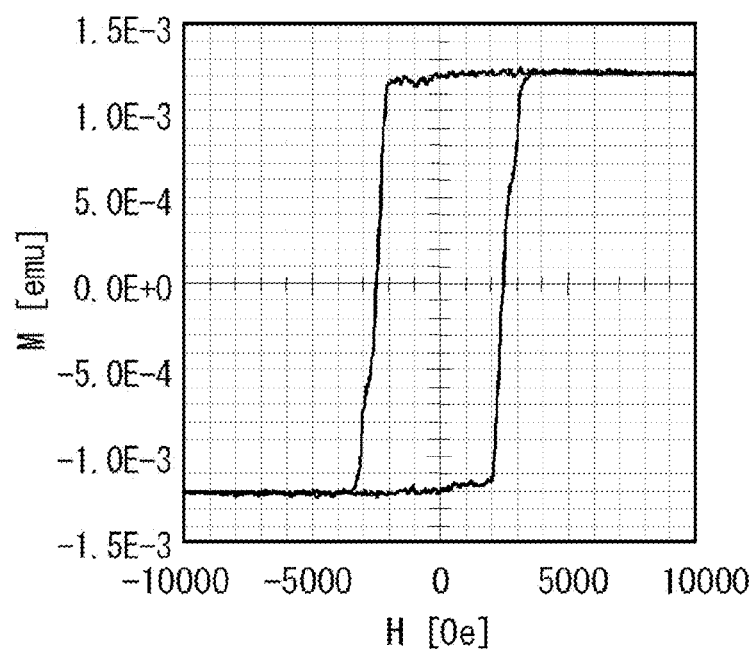
FIG. 13C is a graph showing the magnetization-field curve which indicates the coupling state between a data recording layer and the magnetization fixed layer for a case where the first magnetic underlayer is formed of a NiFeZr film.
Figure 13D:
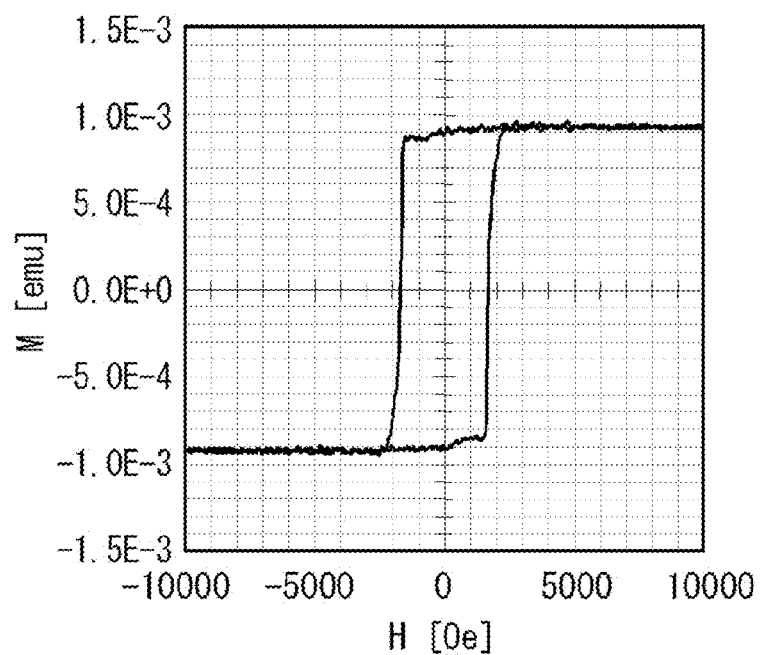
FIG. 13D is a graph showing the magnetization-field curve which indicates the coupling state between a data recording layer and the magnetization fixed layer for a case where the first magnetic underlayer is formed of a CoTa film.
Figure 13E:
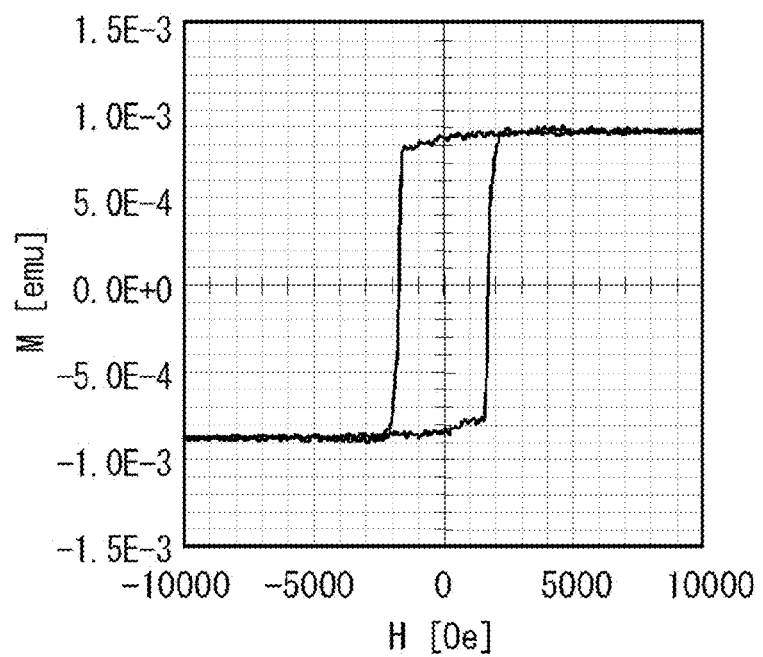
FIG. 13E is a graph showing the magnetization-field curve which indicates the coupling state between a data recording layer and the magnetization fixed layer for a case where the first magnetic underlayer is formed of a CoTa film.

FIGS. 13B to 13E show the magnetization-field curves of the samples thus obtained. In detail, FIGS. 13B and 13C show the hysteresis loops of the samples including the first magnetic underlayer 41 based on a NiFeZr film, and FIGS. 13D and 13E show the hysteresis loops of the samples including the first magnetic underlayer 41A based on a CoTa film. When there is a sufficiently large magnetic coupling between the magnetic film corresponding to the magnetization fixed layers 50a and 50b and the Co/Ni film stack corresponding to the data recording layer 10, a magnetization reversal occurs with the magnetic film and the Co/Ni film stack magnetically coupled as a unit, resulting in that a typical hysteresis loop with no steps is observed as the magnetization-field curve. When the magnetic coupling is weak, on the other hand, magnetization reversals occur separately in the magnetic film and the Co/Ni film stack, resulting in that a stepwise hysteresis loop is observed as the magnetization-field curve.

As shown in FIGS. 13B and 13C, the first magnetic underlayer 41 based on the NiFeZr film achieved a hysteresis loop with no steps for an annealing temperature of 350° C.; however, a stepwise hysteresis loop was observed for an annealing temperature of 300° C. This suggests that the use of a NiFeZr film as the first magnetic underlayer 41 with an annealing temperature of 300° C. undesirably weakened the magnetic coupling between the magnetic film corresponding to the magnetization fixed layers 50a and 50b and the Co/Ni film stack corresponding to the data recording layer 10.

As shown in FIGS. 13D and 13E, on the other hand, the first magnetic underlayer 41A based on the CoTa film achieved a hysteresis loop with no steps for both of the annealing temperatures of 300 and 350° C. This suggests that the use of a CoTa film as the first magnetic underlayer 41A achieves sufficiently strong magnetic coupling between the magnetic film corresponding to the magnetization fixed layers 50a and 50b and the Co/Ni film stack corresponding to the data recording layer 10.

Experiment 3

Magnetic Property of First Magnetic Underlayer 41A

Next, a description is given of the magnetic property and the preferred film thickness range of the first magnetic underlayer 41A. In order to study a portion of the first magnetic underlayer 41A in contact with the interlayer dielectric 60 (formed of a SiN or $SiO_2$ film), CoTa films were formed on substrates in which a SiN film of 20 nm was deposited on a Si substrate, and the magnetizations of the CoTa films were measured. The thicknesses of the formed CoTa films ranged from 0.5 to 5 nm. The formed CoTa films include 20 atomic % tantalum (Ta) and the remainder was Co base metal. The samples were subjected to annealing at 350° C. for two hours in vacuum.

Figure 14A:
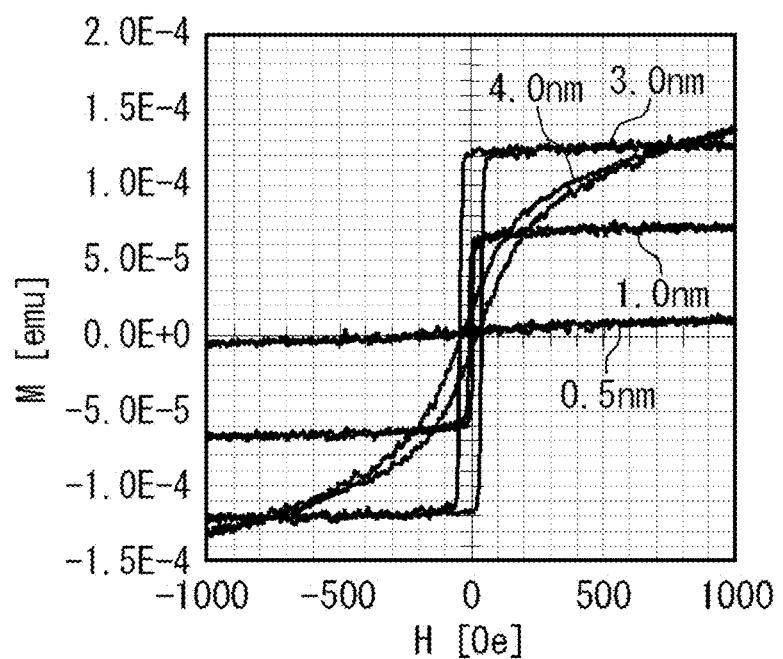
FIG. 14A is a diagram showing the change in the magnetization-field curve against the thickness of the first magnetic underlayer for a case where the first magnetic underlayer is formed of a CoTa film.
Figure 14B:
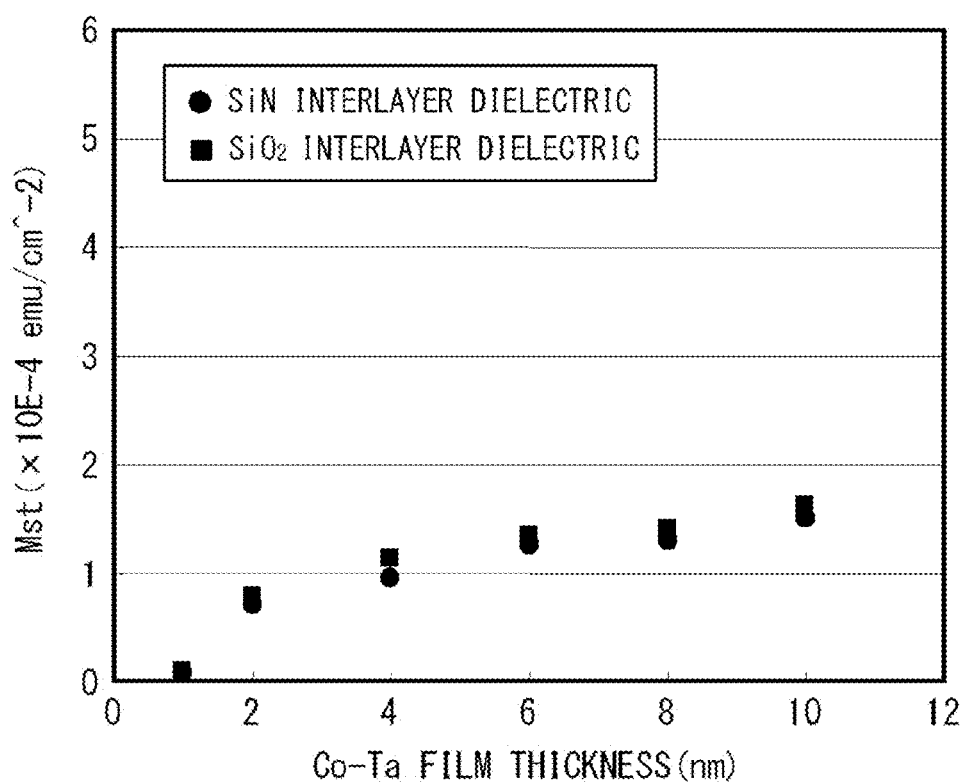
FIG. 14B is a graph showing the change in the magnetization-field curve against the thickness of the first magnetic underlayer for a case where the first magnetic underlayer is formed of a CoTa film.

FIG. 14A shows the magnetization-field curves of the CoTa films when the magnetic field was applied in the perpendicular direction of the film surface in the magnetization measurements, and FIG. 14B shows the change in the magnitude of the magnetization against the thickness of the CoTa film. Such measurements are equivalent to measurements of the perpendicular magnetic anisotropies of the samples. As shown in FIG. 14A, the CoTa film did not exhibit magnetization for a thickness of 0.5 nm. Such CoTa film (which does not exhibit in-plane magnetic anisotropy) is suitable as the first magnetic underlayer 41A, causing no magnetic influence on occurrence of the perpendicular magnetic anisotropy of the data recording layer 10.

In a film thickness range from 1.0 to 3.0 nm, hysteresis loops were obtained as the magnetization-field curves. It should be noted that the magnetizations of the CoTa films in the perpendicular direction of the film surfaces were small in the film thickness range from 1.0 to 3.0 nm as shown in FIG. 14B. The magnetization in the perpendicular direction of the film surface showed a small increase against the increase in the film thickness. This implies that the CoTa film exhibits small perpendicular magnetic anisotropy in the film thickness range of 1.0 to 3 nm. Such CoTa film (which does not exhibit in-plane magnetic anisotropy) is suitable as the first magnetic underlayer 41A, causing no magnetic influence on occurrence of the perpendicular magnetic anisotropy of the data recording layer 10.

It should be noted that the first magnetic underlayer 41A does not provide its originally-intended function of enhancing crystal growth in a film thickness range below 0.5 nm. Therefore, when a CoTa film is used as the first magnetic underlayer 41A, the thickness of the CoTa film is desirably in the range from 0.5 nm to 3.0 nm.

When the film thickness was 4.0 nm, on the other hand, the magnetization in the perpendicular direction of the film surface was reduced as shown in FIG. 14A. This resulted from that a large magnetization was generated in the CoTa film in the in-plane direction, that is, a large in-plane magnetic anisotropy was generated. Since a large in-plane magnetic anisotropy is generated in the CoTa film for film thicknesses of 4.0 nm or more, such CoTa film is not suitable as the first magnetic underlayer 41A.

The above-described results indicate that the preferred film thickness range of the CoTa film as the first magnetic underlayer 41A is from 0.5 nm to 3.0 nm.

The inventors have confirmed that the same applies to the CoZr film, the FeTa film and the FeZr film as well as the CoTa film described above.

Experiment 4

Effect of Structure of Second Magnetic Underlayer 43

Furthermore, the effect of the number of layers of the second magnetic underlayer 43 in the magnetoresistance effect element was examined where the above-described first magnetic underlayer 41A of the second embodiment is applied. Specifically, samples of the following structures were prepared: A first magnetic underlayer 41, a non-magnetic underlayer 42 and a second magnetic underlayer 43 were sequentially layered in this order as the underlayer 40A of each magnetoresistance effect element. A CoTa film of a thickness of 1.5 nm was used as the first magnetic underlayer 41A, and a Pt film of a thickness of 2 nm was used as the non-magnetic underlayer 42. The CoTa film included 20 atomic % tantalum (Ta) and the remainder was Co base metal. A magnetic film stack in which one or more Co films of a thickness of 0.4 nm and one or more Pt films of a thickness of 0.8 nm were alternately layered was used as the second magnetic underlayer 43. A Co/Ni film stack in which five Co films of a thickness of 0.3 nm and five Ni films of a thickness of 0.6 nm were alternately layered was used as the data recording layer 10. The magnetoresistance effect elements 100 of the above-described structure were prepared, wherein the number of the Co and Pt films in the second magnetic underlayer 43 was varied from zero to four. The width of the samples was 100 nm. These samples were subjected to annealing at 350° C. for two hours in vacuum, after the underlayer 40A and the data recording layer 10 were formed.

Figure 15A:
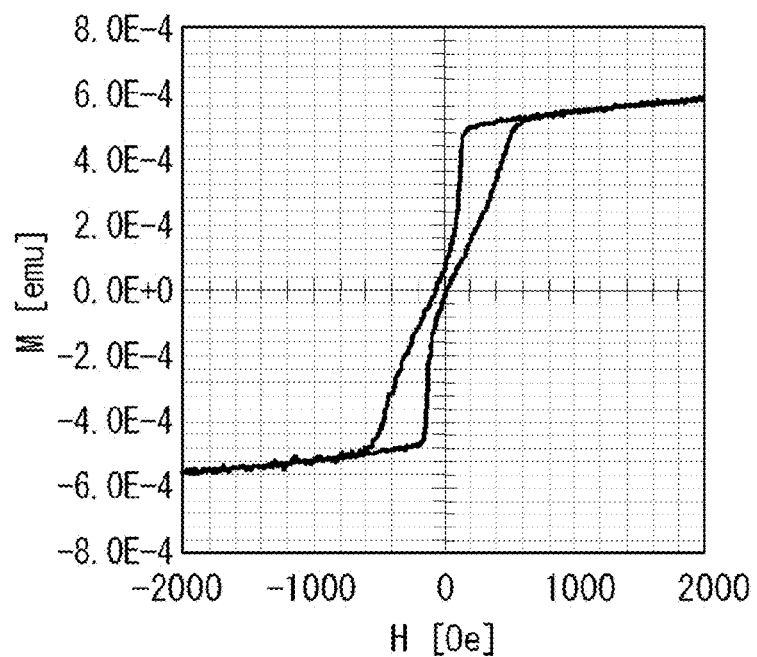
FIG. 15A is a graph showing the magnetization-field curve of the data recording layer for a case where the second magnetic underlayer is not provided in the second embodiment.
Figure 15B:
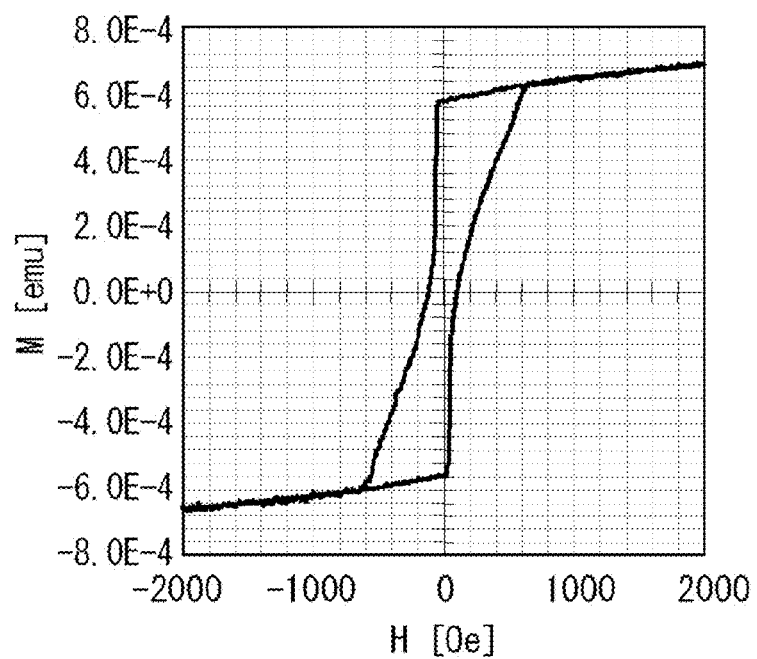
FIG. 15B is a graph showing the magnetization-field curve of the data recording layer for a case where the number of Co and Pt films in the second magnetic underlayer is one in the second embodiment.
Figure 15C:
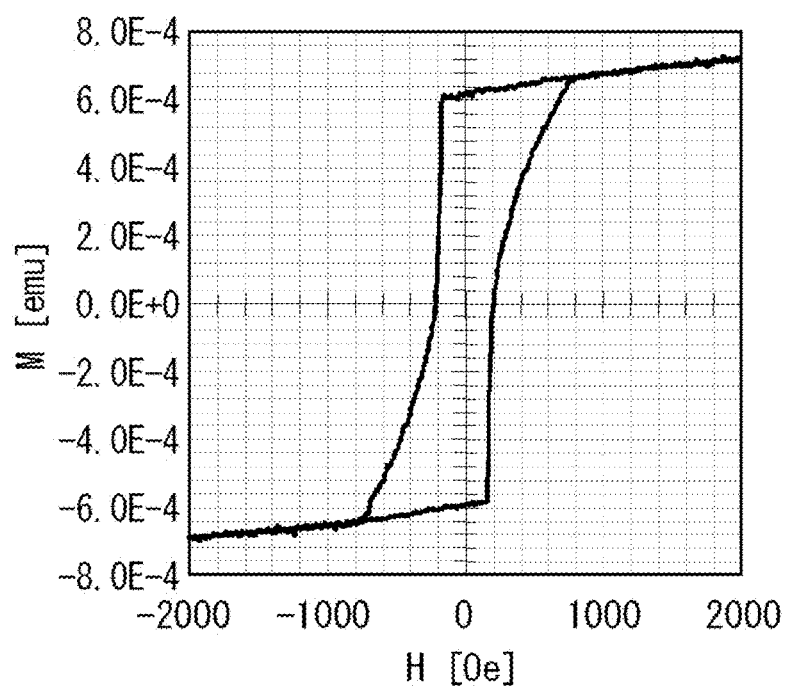
FIG. 15C is a graph showing the magnetization-field curve of the data recording layer for a case where the number of Co and Pt films in the second magnetic underlayer is two in the second embodiment.

FIGS. 15A to 15C are diagrams showing the magnetization-field curves of the data recording layers 10 for cases where the number of the Co and Pt films within the second magnetic underlayer 43 was zero to two. For the case where the number of the Co and Pt films was zero (that is, the case where the second magnetic underlayer 43 was not provided), as shown in FIG. 15A, the data recording layer 10 exhibited relatively weak perpendicular magnetic anisotropy, incorporating an in-plane magnetization component. As shown in FIGS. 15B and 15C, on the other hand, there was a tendency in which the M-H loops became more rectangular and the perpendicular magnetic anisotropy was enhanced as the number of the layered Co and Pt films was increased. This implies that the use of the second magnetic underlayer 43 enables achieving strong perpendicular magnetic anisotropy for the case where a Co/Ni film stack, for which it is relatively difficult to achieve the fcc (111) orientation, is used as the data recording layer 10, even after the annealing at 350° C. for two hours.

This fact has two technical meanings: First, the use of a Co/Pt magnetic film stack as the data recording layer 10 effectively achieves strong perpendicular anisotropy for the data recording layer 10. Second, the use of a Co/Pt magnetic film stack as the second magnetic underlayer 43 enables forming the second magnetic underlayer 43 with improved fcc (111) orientation, effectively improving the perpendicular magnetic anisotropy of the data recording layer 10 formed thereon (for example, formed of a Co/Ni magnetic film stack).

Figure 16:
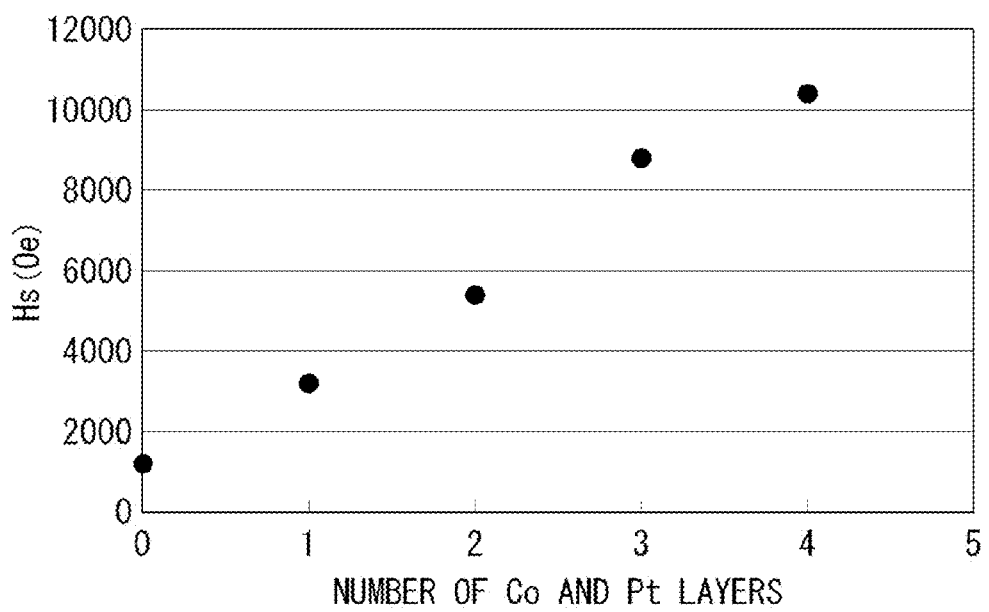
FIG. 16 is a graph showing the change in the saturation field $H_S$ against the number of Co and Pt films in the second magnetic underlayer in the second embodiment.

Furthermore, the saturation field $H_S$ was measured for a case where a CoTa film was used as the first magnetic underlayer 41A, a Co/Pt magnetic film stack was used as the second magnetic underlayer 43 and a Co/Ni magnetic film stack was used as the data recording layer 10. FIG. 16 shows the change in the saturation field $H_S$ of the data recording layer 10 against the number of the Co and Pt films in the second magnetic underlayer 43, where the number of the Co and Pt films was varied from zero to four. As is understood from FIG. 16, the saturation field $H_S$ was increased as the number of the Co and Pt films in the second magnetic underlayer 43; this implies that the perpendicular magnetic anisotropy was enhanced as the number of the Co and Pt films was increased.

Figure 17:
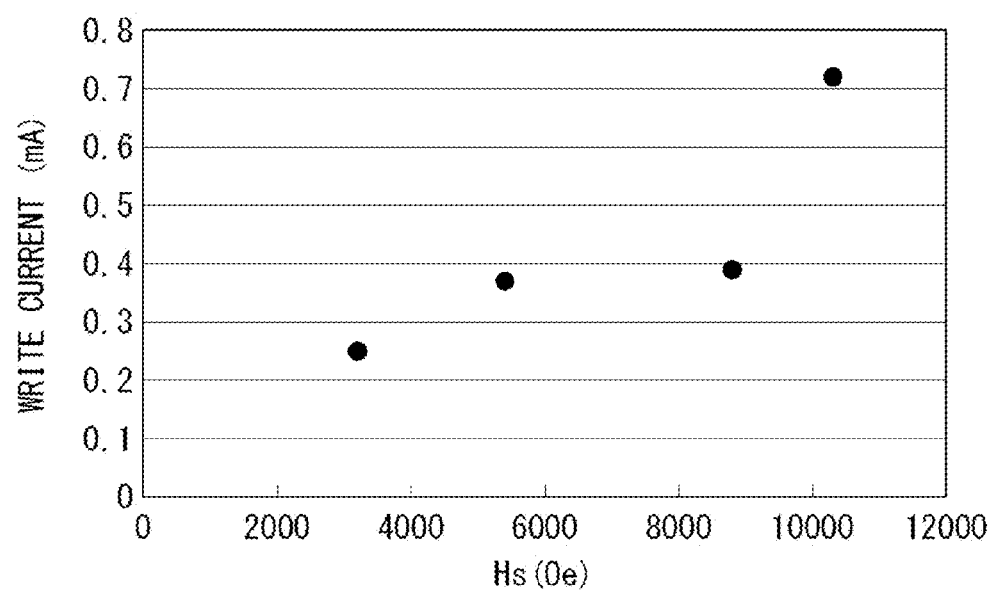
FIG. 17 is a graph showing the relation among the number of the Co and Pt films in the second magnetic underlayer, the saturation field $H_S$ and the write current in the second embodiment.

FIG. 17 shows the changes in the saturation field $H_S$ and the write current against the number of the Co and Pt films in the second magnetic underlayer 43. The magnitude of the write current is defined as the minimum write current necessary for causing domain wall motion in the data recording layer 10. Details of the experimental procedure are also described in T. Suzuki et al., "Evaluation of Scalability for Current-Driven Domain Wall Motion in a Co/Ni Multilayer Strip for Memory Applications", IEEE TRANSACTIONS ON MAGNETICS, VOL. 45, No. 10, pp. 3776-3779, (2009), the disclosure of which is incorporated herein by reference.

For samples in which the number of the Co and Pt films in the second magnetic underlayer 43 was zero (this implies that the second magnetic underlayer 43 was not deposited), domain wall motion by the current was not observed clearly, resulting in an unsuccessful measurement of the write current. This can be considered as resulting from that the data recording layer 10 exhibited relatively weak perpendicular magnetic anisotropy and incorporated in-plane magnetization components as shown in FIG. 15A.

For cases where the number of the Co and Pt films in the second magnetic underlayer 43 was not zero, the write current was gradually increased as the number of the Co and Pt films was increased. For the case where the number of the Co and Pt films was four, the saturation field $H_S$ was increased up to about 10000 (Oe) and the write current was steeply increased to exceed 0.5 mA. According to N. Sakimura et al., "MRAM Cell Technology for Over 500-MHz SoC", IEEE JOURNAL OF SOLID-STATE CIRCUITS, VOL. 42, No. 4, pp. 830-838, 2007, the cell area can be reduced to the level of existing embedded SRAMs by reducing the write current below 0.5 mA.

As thus described, the use of a Co/Pt film stack as the second magnetic underlayer 43 effectively enhanced the perpendicular magnetic anisotropy of the data recording layer 10, when a CoTa film was used as the first magnetic underlayer 41A and a Co/Ni film stack was used as the data recording layer 10. In addition, the adjustment of the number of the Co and Pt films in the second magnetic underlayer 43 enabled controlling the perpendicular magnetic anisotropy of the data recording layer 10, sufficiently reducing the write current necessary for causing domain wall motion (or the domain wall motion current). The range of the saturation field $H_S$ preferable for adjusting the perpendicular magnetic anisotropy to an appropriate value was 3000 (Oe)≤$H_S$≤10000 (Oe), and the number of the Co and Pt films in the second magnetic under layer 43 for achieving a saturation field $H_S$ in this range was one to three.

Furthermore, the effect of the film thickness ratio of the Pt and Co films in the second magnetic underlayer 43 was examined. In detail, the first magnetic underlayer 41A, the non-magnetic underlayer 42 and the second magnetic underlayer 43 were serially formed in this order as the underlayer 40A. A CoTa film of a thickness of 1.5 nm was used as the first magnetic underlayer 41A, and a Pt film of a thickness of 2 nm was used as the non-magnetic underlayer 42. A magnetic film stack in which multiple Co films and multiple Pt films were alternately layered was used as the second magnetic underlayer 43. A Co/Ni film stack in which five Co films of a thickness of 0.3 nm and five Ni films of a thickness of 0.6 nm were alternately layered was used as the data recording layer 10. The samples were subjected to annealing at 350° C. for two hours in vacuum. For the samples thus structured, the change in the magnetization field $H_S$ was examined against the film thickness ratio of the Pt and Co films in the second magnetic underlayer 43 and the number of the Pt and Co films.

Figure 18:
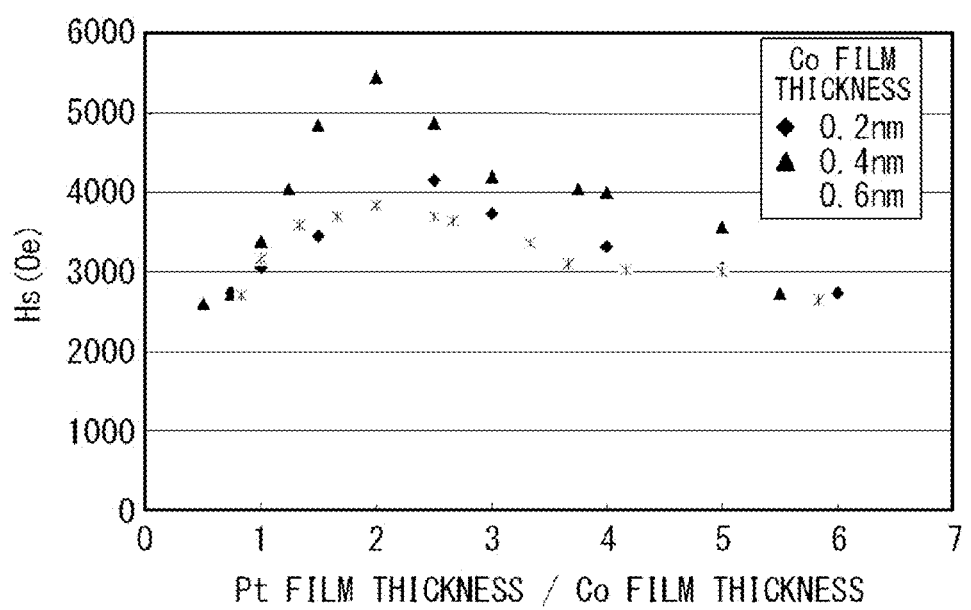
FIG. 18 is a graph showing the relation between the thickness ratio of the Co and Pt films in the second magnetic underlayer and the saturation field $H_S$ in the second embodiment, where a CoTa film is used as a first magnetic underlayer.

FIG. 18 is a graph showing the change in the magnetization field $H_S$ against the number of the Pt and Co films of the second magnetic underlayer 43 for different film thickness ratios of the Pt and Co films. As is understood from FIG. 18, for a case where the film thickness ratio of the Pt films to the Co films in the second magnetic underlayer 43 was 1.0 to 5.0, the saturation field $H_S$ ranged from 3000 to 5500 (Oe) when the number of the Co films and Pt films was one to three; this implies that the data recording layer 10 exhibited such perpendicular magnetic anisotropy that current-driven domain wall motion could be achieved.

Third Embodiment

Figure 19A:
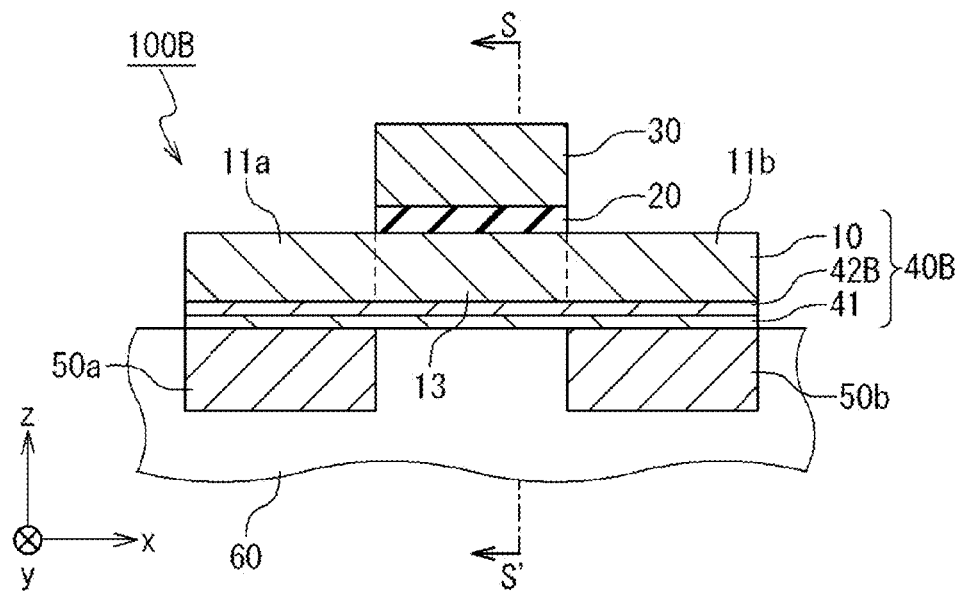
FIGS. 19A and 19B are section views showing an exemplary structure of a magnetoresistance effect element of a third embodiment of the present invention.
Figure 19B:
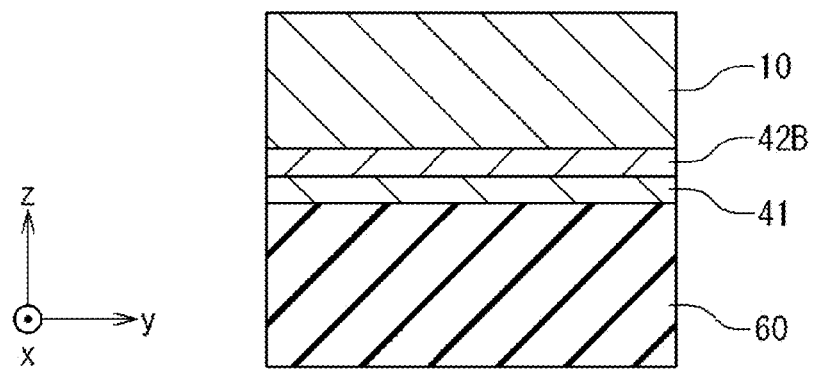

FIG. 19A is a section view showing an exemplary configuration of a magnetoresistance effect element 100B of a third embodiment of the present invention, and FIG. 19B is a section view showing an exemplary configuration of a magnetic recording layer of the magnetoresistance effect element 100B of the third embodiment. It should be noted that FIG. 19B is the section view on the SS' section in FIG. 19A.

The magnetoresistance effect element 100B of the third embodiment is structured similarly to the magnetoresistance effect element 100 of the first embodiment. The difference exists in the structure of the underlayer. In the first embodiment, the underlayer 40 incorporates the first magnetic underlayer 41, the non-magnetic underlayer 42 and the second magnetic underlayer 43. In the third embodiment, on the other hand, the underlayer 40B fails to include a component corresponding to the second magnetic underlayer 43 of the first embodiment, while incorporating the magnetic underlayer 41 and an intermediate layer 42B (which corresponds to a non-magnetic underlayer). The data recording layer 10 is formed on the intermediate layer 42B. In the first embodiment, it has been already discussed that the second magnetic underlayer 43 is not an essential component; in this embodiment, a preferred structure will be presented for a case where the second magnetic underlayer 43 is not provided.

The magnetization fixed layers 50a and 50b are embedded in grooves formed on the interlayer dielectric 60. Embedded under the interlayer dielectric 60 (such as, $SiO_2$ and $SiN_x$) are elements (such as, selection transistors Tra and Trb) and interconnections (such as, word lines WL and bit lines BL and /BL).

The magnetic underlayer 41 is formed on the upper faces of the interlayer dielectric 60 and the magnetization fixed layers 50a and 50b. The magnetic underlayer 41 is in contact with the upper faces of the magnetization fixed layers 50a and 50b on the bottom face (−z side) at the end portions (in the x directions). The magnetic underlayer 41 is formed of magnetic material. As discussed above, the ferromagnetism of the magnetic underlayer 41 enhances the magnetic coupling between the magnetization fixed layers 50a, 50b and the data recording layer 10.

It is preferable that the magnetic underlayer 41 is amorphous or has a microcrystalline structure, since this improves the surface flatness of the magnetic underlayer 41. The microcrystalline structure of the magnetic underlayer 41 may be in a crystalline phase formed of crystals with grain sizes of several to 20 nm, for example. Alternatively, the magnetic underlayer 41A may be formed as a mixture of a crystalline phase and amorphous phase. The smooth surface of the magnetic underlayer 41 is preferable for forming the data recording layer 10, which is deposited above the magnetic underlayer 41 across the intermediate layer 42B, so that the data recording layer 10 has desired crystallinity. When the data recording layer 10 is a $[Co/Ni]_n$/Pt film, for example, the smooth surface of the magnetic underlayer 41 is preferable for allowing the [Co/Ni] film stack to exhibit fcc (111) orientation, which causes high perpendicular magnetic anisotropy.

The magnetic underlayer 41 includes at least one of Ni, Fe and Co as the major constituent and at least one non-magnetic element selected from the group consisting of Zr, Hf, Ti, V, Nb, Ta, W, B and N. Please note the "major constitute" means the constituent which exists most in the magnetic underlayer 41. The magnetic underlayer 41 may be formed of, for example, NiFeZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi or CoTi.

The intermediate layer 42B is a non-magnetic body formed to cover the magnetic underlayer 41. In order to enhance the perpendicular magnetic anisotropy of the data recording layer 10, which is formed on the intermediate layer 42B, the intermediate layer 42B is preferably formed of material with a small surface energy to improve the crystalline orientation. In one example, the intermediate layer 42B is formed of a Ta film. When the intermediate layer 42B is formed of a Ta film, the intermediate layer 42B preferably has a thickness of 0.1 to 2.0 nm, as described below. When the thickness of the intermediate layer 42B is less than 0.1 nm, the effect of the enhancement of the perpendicular magnetic anisotropy of the data recording layer 10 is significantly deteriorated. When the thickness of the intermediate layer 42B is more than 2.0 nm, the magnetic coupling is lost between the magnetization fixed layers 50a, 50b and the data recording layer 10.

The data recording layer 10 is a ferromagnetic body with perpendicular magnetic anisotropy which is formed to cover the intermediate layer 42B. The magnetization fixed regions 11a, 11b and the magnetization free region 13 are formed within the data recording layer 10. In other words, the data recording layer 10 is a region in which a domain wall is formed and data are stored as the magnetization direction of the magnetization free region 13 or as the position of the domain wall. The recording layer 10 may be formed of ferromagnetic material with perpendicular magnetic anisotropy, such as those described in the first and second embodiments.

In the following, an example of the magnetoresistance effect element of the third embodiment is described with comparison with comparative examples. The saturation field is used as the index of the magnitude of the perpendicular magnetic anisotropy. The definition of the saturation field is as defined above with reference to FIG. 7.

Comparative Example 1

Figure 20A:
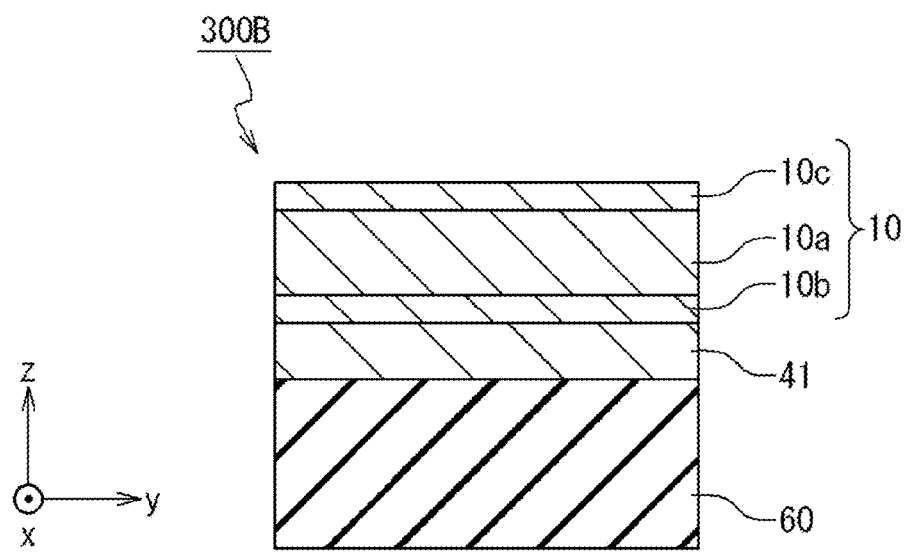
FIGS. 20A and 20B are section views showing an exemplary structure of a magnetoresistance effect element of comparative example 1.
Figure 20B:
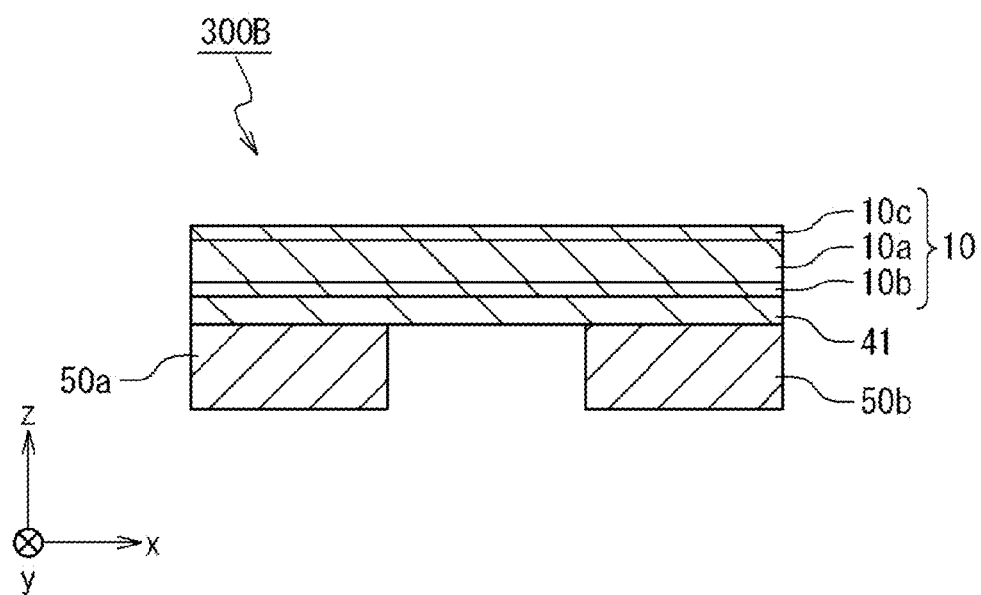

FIGS. 20A and 20B are section views showing the configuration of a magnetoresistance effect element 300B of comparative example 1. It should be noted that the spacer layer 20 and the reference layer 30 are not shown. A $SiO_2$ film was used as the interlayer dielectric 60 in one example. A $[Co/Ni]_n$/Pt film stack in which a Pt film 10b and a Co/Ni film stack 10a were layered was used as the data recording layer 10, where the Co/Ni film stack 10a was formed of Co films and Ni films which were alternatively layered; the $[Co/Ni]_n$/Pt film stack exhibits perpendicular magnetic anisotropy and is suitable for domain wall motion. A Pt film 10c was additionally deposited as a cap layer.

The $[Co/Ni]_n$/Pt film stack exhibits high perpendicular magnetic anisotropy when the Co/Ni film stack incorporated therein has fcc (111) orientation. The crystalline orientation of the Co/Ni film stack, however, depends on the material and structure of the underlayer, and the magnitude of the perpendicular magnetic anisotropy also depends on the material and structure of the underlayer. In comparative example 1, the data recording layer 10 was deposited directly on the magnetic underlayer 41 without using the intermediate layer 42B. A NiFeZr film of a thickness of 2.0 nm was used as the magnetic underlayer 41. In this experiment, the samples were not patterned to evaluate the intrinsic magnetic properties. That is, the magnetic properties of the data recording layer 10 were evaluated in the as-deposited state (in the state of an as-deposited Pt/$[Co/Ni]_n$/Pt/NiFeZr film stack). A vibrating sample magnetometer (VSM) was used for the evaluation of the magnetic properties (the same goes for the following).

Figure 21A:
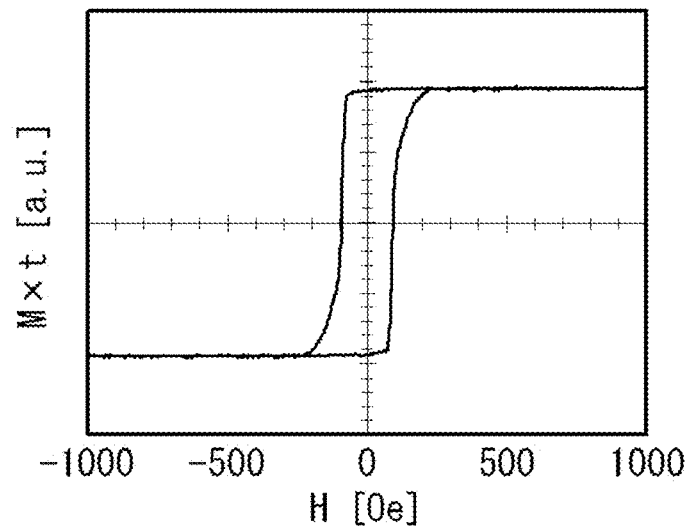
FIG. 21A is a graph showing an exemplary magnetization curve for a case where an external magnetic field is applied to the data recording layer structured as shown in FIGS. 20A and 20B.
Figure 21B:
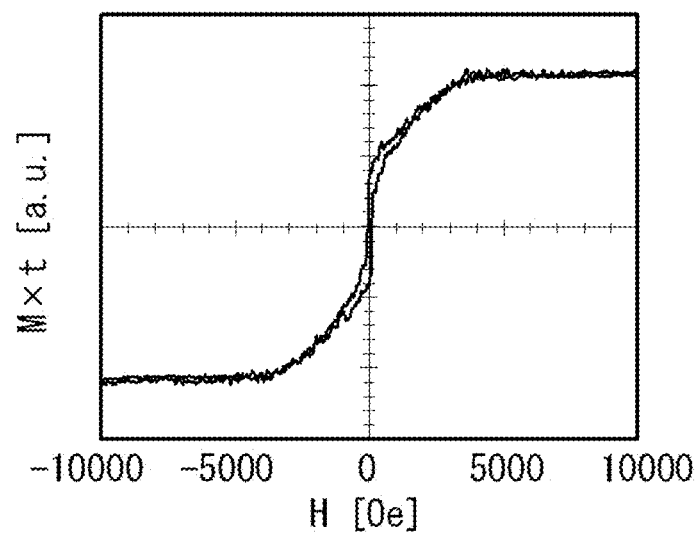
FIG. 21B is a graph showing an exemplary magnetization curve for a case where an external magnetic field is applied to the data recording layer structured as shown in FIGS. 20A and 20B.

First, a description is given of the magnetic property of the data recording layer 10 before subjected to an annealing process after the deposition. FIGS. 21A and 21B are graphs showing exemplary magnetization curves in a case where external magnetic fields were applied to the data recording layer 10 of the structure shown in FIGS. 20A and 20B. The vertical axis represents the product of the magnetization M and the film thickness t (arbitrary unit) and the horizontal axis represents the applied external field H (Oe). It should be noted that FIG. 21A shows the magnetization curve in a case where the external magnetic field H was applied in the perpendicular direction of the film surface, and FIG. 21B shows the magnetization curve in a case where the external magnetic field H was applied in the in-plane direction of the film surface. The magnetization curve for the perpendicular magnetic field (the perpendicular loop shown in FIG. 21A) showed a steep shape and a large hysteresis, while the magnetization curve for the in-plane magnetic field (the in-plane loop shown in FIG. 21B)

showed a slanting shape. This implies that the data recording layer 10 exhibited perpendicular magnetic anisotropy. In other words, the [Co/Ni]$_n$/Pt film stack on the NiFeZr film exhibited perpendicular magnetic anisotropy, and there was a possibility in which the [Co/Ni]$_n$/Pt film stack might be suitable for domain wall motion.

Figure 22A:
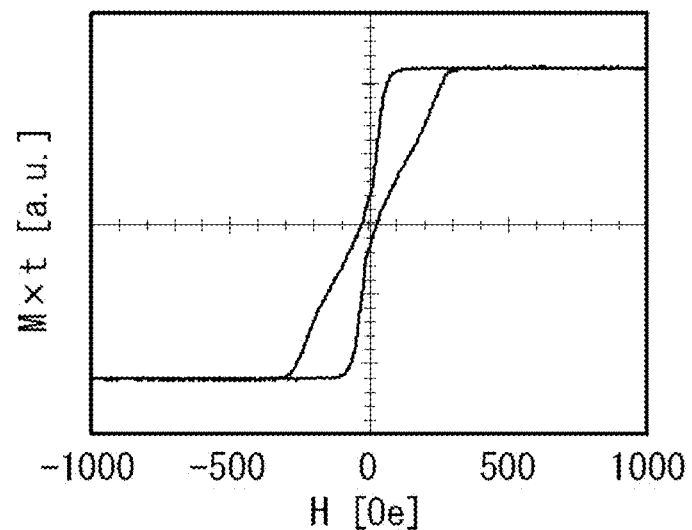
FIG. 22A is a graph showing an exemplary magnetization curve for a case where an external magnetic field is applied to the data recording layer structured as shown in FIGS. 20A and 20B after the data recording layer is subjected to thermal annealing.
Figure 22B:
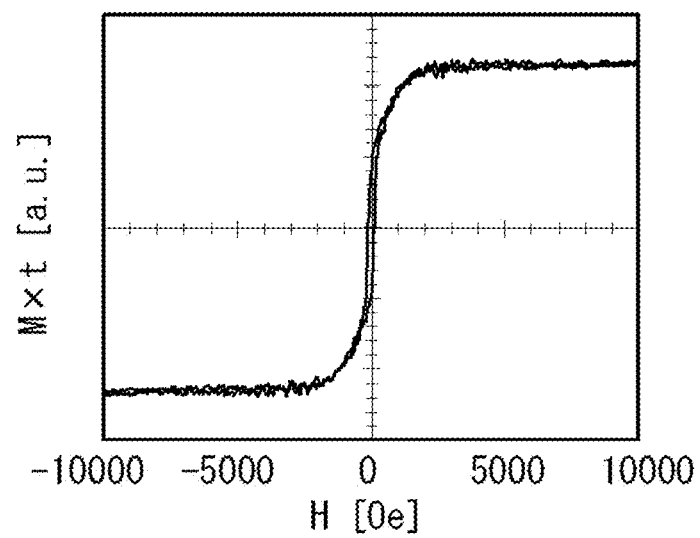
FIG. 22B is a graph showing an exemplary magnetization curve for a case where an external magnetic field is applied to the data recording layer structured as shown in FIGS. 20A and 20B after the data recording layer is subjected to thermal annealing.

Next, a description is given of the magnetic property of the data recording layer 10 after subjected to a thermal annealing in inert gas at 300° C. for two hours. FIGS. 22A and 22B are graphs showing exemplary magnetization curves in a case where external magnetic fields were applied to the data recording layer 10 of the structure shown in FIGS. 20A and 20B after the data recording layer 10 was subjected to the thermal annealing. The vertical axis represents the product of the magnetization M and the film thickness t (arbitrary unit) and the horizontal axis represents the applied external field H (Oe). It should be noted that FIG. 22A shows the magnetization curve in a case where the external magnetic field H was applied in the perpendicular direction of the film surface, and FIG. 22B shows the magnetization curve in a case where the external magnetic field H was applied in the in-plane direction of the film surface. Compared to FIGS. 21A and 21B, the perpendicular loop was deformed into a more slanting shape as shown in FIG. 22A, while the in-plane loop was modified into a more steep shape as shown in FIG. 22B. This implies that the perpendicular magnetic anisotropy of the data recording layer 10 was deteriorated by the thermal annealing at 300° C. Furthermore, as is understood from the comparison between FIGS. 21A and 22A, the product of the saturation magnetization and the thickness ($M_s \times t$) was increased after the thermal annealing, as shown in FIG. 22A. This results from that the NiFeZr film, which intrinsically has in-plane magnetic anisotropy, was magnetically coupled to the [Co/Ni]$_n$/Pt film stack by the thermal annealing at 300° C., causing an increase in the magnetization. The magnetic coupling between the NiFeZr film and the [Co/Ni]$_n$/Pt film stack deteriorates the perpendicular magnetic anisotropy of the [Co/Ni]$_n$/Pt film stack.

Comparative Example 2

In comparative example 2, the structure of the data recording layer 10 was the same as that in comparative example 1 (in which a NiFeZr film was used as the magnetic underlayer 41), except for that a Ta film was used in place of the magnetic underlayer 41. When the Ta film is used, the thickness of the Ta film was required to be 4.0 nm or more, in order to achieve fcc(111) orientation of the Co/Ni film stack. This thickness is very large, twice as large as the film thickness of the NiFeZr film (2.0 nm) in comparative example 1. Due to the large thickness of the Ta film, which is non-magnetic material, it was difficult to achieve magnetic coupling between the magnetization fixed layers 50a, 50b and the data recording layer 10 in comparative example 2. This potentially results in that the magnetizations of the magnetization fixed regions 11a and 11b are not fixed and data cannot be stored in the data recording layer 10.

From comparative examples 1 and 2, the inventors created the following embodiment example, considering avoiding unnecessary magnetic coupling between the NiFeZr film and the [Co/Ni]$_n$/Pt film stack after the thermal annealing and avoiding disconnection of the magnetic coupling between the magnetization fixed layers 50a, 50b and the data recording layer 10.

Embodiment Example 1

Figure 23A:
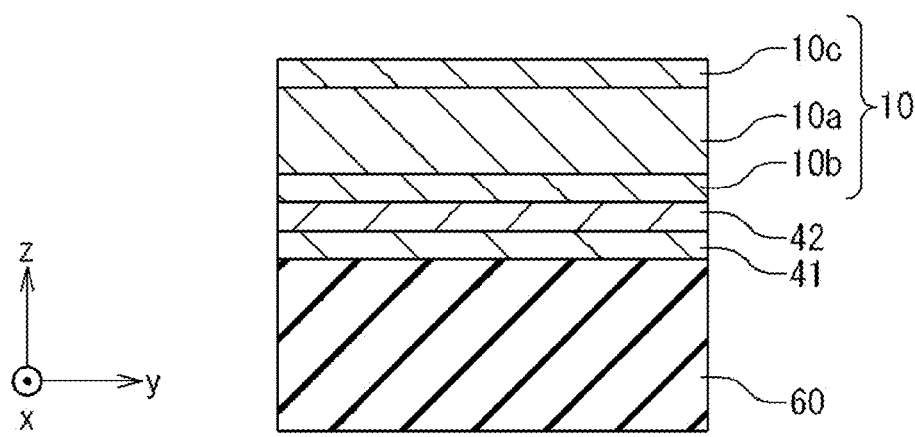
FIGS. 23A and 23B are section views showing the configuration of a magnetoresistance effect element of embodiment example 1.
Figure 23B:
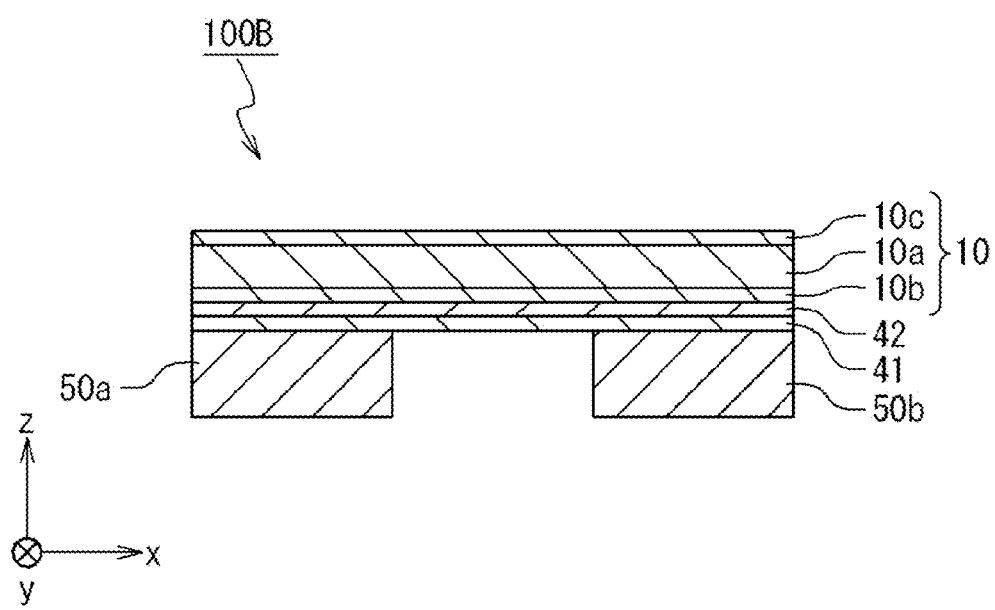

FIGS. 23A and 23B shows section views showing an exemplary structure of a magnetoresistance effect element of embodiment example 1. It should be noted that the spacer 20 and the reference layer 30 are not shown. A SiO$_2$ film was used as the interlayer dielectric 60 in one example. As is the case with comparative example 1, a [Co/Ni]$_n$/Pt film stack in which a Pt film 10b and a Co/Ni film stack 10a were layered was used as the data recording layer 10, where the Co/Ni film stack 10a was formed of Co films and Ni films which were alternatively layered; the [Co/Ni]$_n$/Pt film stack exhibits perpendicular magnetic anisotropy and is suitable for domain wall motion. A Pt film 10c was also additionally deposited as a cap layer.

Embodiment example 1 was modified from comparative example 1, so that the intermediate layer 42B was inserted between the magnetic underlayer 41 (the NiFeZr film) and the data recording layer 10 (the [Co/Ni]$_n$/Pt film stack) so that they were not magnetically coupled. A Ta film of a thickness of 2.0 nm was used as the intermediate layer 42B. The samples were subjected to a thermal annealing at 300° C. for two hours in inert gas, after being formed into a Pt/[Co/Ni]$_n$/Pt/Ta/NiFeZr film stack.

Next, a description is given of the magnetic property of the data recording layer 10 after subjected to a thermal annealing in inert gas at 300° C. for two hours.

Figure 24A:
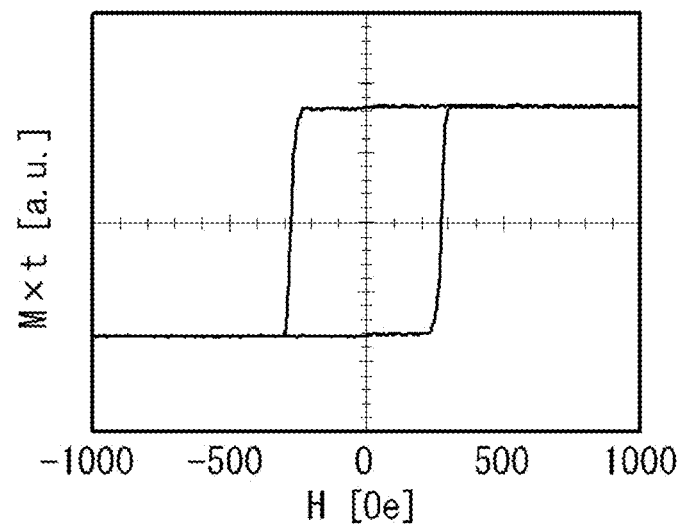
FIG. 24A is a graph showing an exemplary magnetization curve for a case where an external magnetic field is applied to the data recording layer structured as shown in FIGS. 23A and 23B.
Figure 24B:
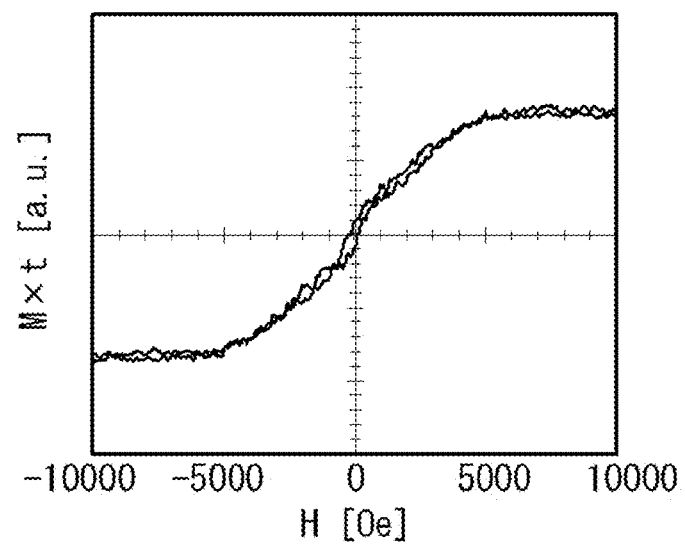
FIG. 24B is a graph showing an exemplary magnetization curve for a case where an external magnetic field is applied to the data recording layer structured as shown in FIGS. 23A and 23B.

FIGS. 24A and 24B are graphs showing exemplary magnetization curves in a case where external magnetic fields were applied to the data recording layer 10 of the structure shown in FIGS. 23A and 23B. The vertical axis represents the product of the magnetization M and the film thickness t (arbitrary unit) and the horizontal axis represents the applied external field H (Oe). It should be noted that FIG. 24A shows the magnetization curve in a case where the external magnetic field H was applied in the perpendicular direction of the film surface, and FIG. 24B shows the magnetization curve in a case where the external magnetic field H was applied in the in-plane direction of the film surface. As is understood from the comparison to FIGS. 21A, 21B, 22A and 22B, the data recording layer 10 of embodiment example 1 showed a more slanting in-plane loop and this means that a larger perpendicular magnetic anisotropy was achieved even after the thermal annealing at 350° C. Furthermore, as is understood from the comparison to FIG. 22B, the saturation field $H_S$ (See FIG. 7) was increased in embodiment example 1, as shown in FIG. 24B. In other words, the data recording layer 10 of embodiment example 1 showed a larger external magnetic field necessary for directing the magnetization in the direction of the external magnetic field as shown in FIG. 24B. As thus described, the data recording layer 10 for which the Ta film was inserted as the intermediate layer 42B as shown in FIGS. 23A and 23B exhibited larger perpendicular magnetic anisotropy than the data recording layer 10 shown in FIGS. 20A and 20B, from which the intermediate layer 42B was excluded.

Figure 25:
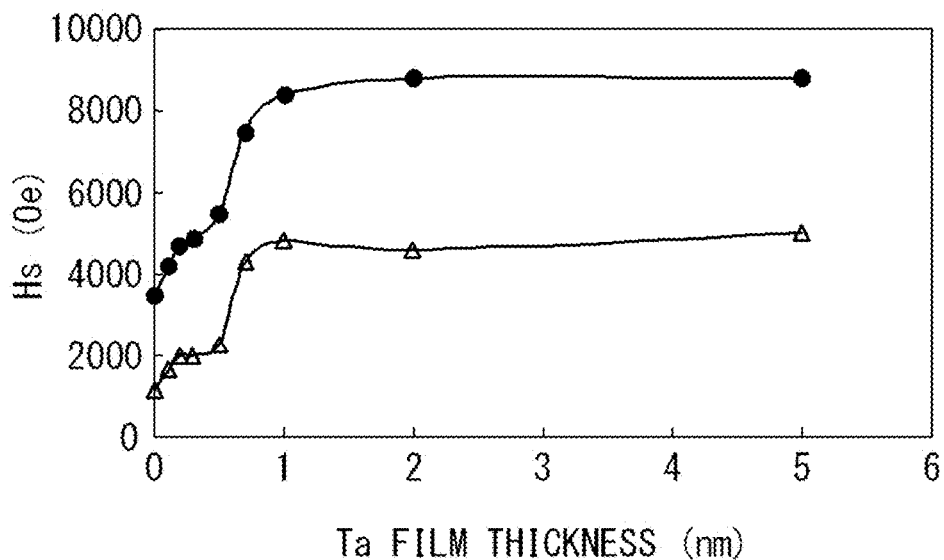
FIG. 25 is a graph showing the relation among the thickness of an intermediate layer, the temperature of the thermal annealing and the saturation field.

In the following, a description is given of the change in the saturation field $H_S$ against the thickness of the intermediate layer 42B and the temperature of the thermal annealing. FIG. 25 is a graph showing one example of the change in the saturation field $H_S$ against the thickness of the intermediate layer 42B and the temperature of the thermal annealing. The vertical axis represents the saturation field $H_S$ (Oe) and the horizontal axis represents the thickness of the Ta film used as the intermediate layer 42B. The circular dots indicate the saturation field $H_S$ obtained after the thermal annealing at 200° C., and the triangular marks indicate the saturation field $H_S$ obtained after the thermal annealing at 350° C. For both of the thermal annealing processes at 200° C. and 350° C., the data recording layer 10 for which the Ta film was provided with a thickness of 0.1 nm or more showed higher saturation fields $H_S$ and exhibited larger perpendicular magnetic anisotropy, compared to the data recording layer 10 for which the Ta film was not provided. The saturation field $H_S$ was saturated for the configuration in which the thickness of the Ta film was 2.0 nm or more. This implies that it is unnecessary to increase the thickness of the Ta film more than 2.0 nm. Rather, the magnetization fixed layers 50a and 50b cannot be magnetically coupled to the data recording layer 10 if the thickness of the Ta film, which is non-magnetic, is excessively increased. This potentially results in that the magnetizations of the magnetization fixed regions 11a and 11b are not fixed and data cannot be stored in the data recording layer 10. In addition, the increases in the thicknesses of the magnetic underlayer 41 and the intermediate layer 42B increase the section area of the route of the write current, including the data recording layer 10, and this may cause difficulty in the control of the write current due to the manufacture variations. Therefore, the Ta film preferably has a thickness of 0.1 to 2.0 nm, more preferably, 0.2 nm to 1.0 nm.

As is understood from the above-described results, the insertion of the intermediate layer 42B (for example, a Ta film) allowed the data recording layer 10 shown in FIGS. 23A and 23B to exhibit higher perpendicular magnetic anisotropy even after the high temperature thermal annealing at 350° C., compared to the data recording layer 10 for which the intermediate layer 42B was not inserted (that is, the thickness of the Ta film is zero). This can be considered as resulting from that the magnetic coupling between the NiFeZr film (the magnetic underlayer 41), which has in-plane magnetic anisotropy, and the $[Co/Ni]_n$/Pt film stack (the data recording layer 10) was suppressed by the Ta film (the intermediate layer 42B).

In addition, it was confirmed that the magnetic coupling was maintained between the magnetization fixed layers 50a, 50b and the data recording layer 10, even for the case where the sum of the thicknesses of the intermediate layer 42B and the magnetic underlayer 41 was as large as 4.0 nm. In other words, the magnetizations of the magnetization fixed regions 11a and 11b were fixed by the magnetization fixed layers 50a and 50b. This may be because the increase in the total thickness up to 4.0 nm was the result of the increases in the thicknesses of both of the non-magnetic Ta film and the magnetic NiFeZr film, not the result of the increase in the thickness of only the non-magnetic Ta film. The magnetic NiFeZr film possibly provides some contribution to the magnetic coupling between the magnetic fixed layers 50a, 50b and the data recording layer 10.

As thus described, the insertion of a Ta film of a thickness of 0.1 to 2.0 nm as the intermediate layer 42B between the magnetic underlayer 41 and the data recording layer 10 effectively improves the perpendicular magnetic anisotropy and the suitability to domain wall motion of the data recording layer 10. The insertion of the Ta film also provides thermal resistance for the data recording layer 10, avoiding an undesired influence on the magnetic coupling between the magnetization fixed layers and the magnetization fixed regions of the data recording layer 10. As a result, a magnetic memory can be obtained in which the data recording layer exhibits strong perpendicular magnetic anisotropy after the completion of the manufacture process of the magnetic memory.

Embodiment Example 2

Figure 26:
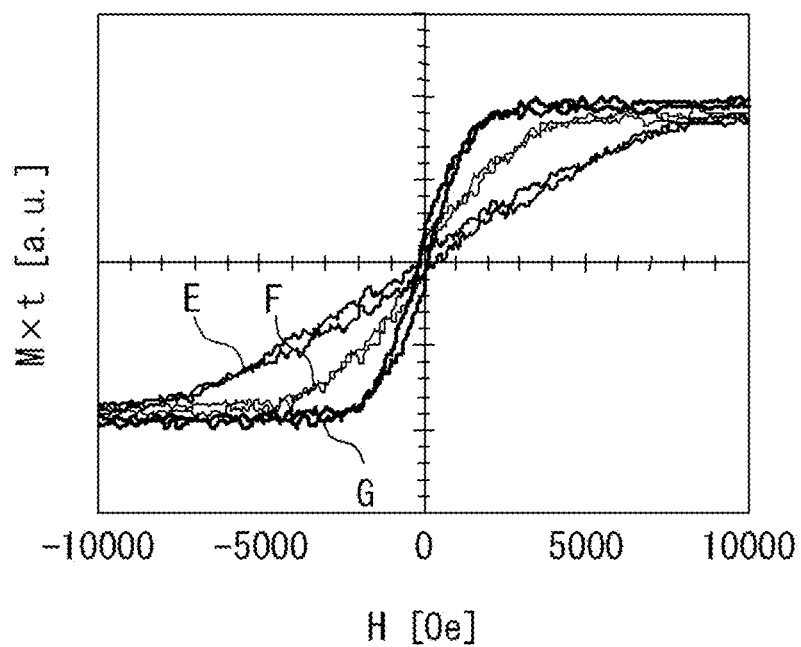
FIG. 26 is a graph showing an exemplary magnetization curve for a case where an external magnetic field is applied to the data recording layer structured as shown in FIGS. 23A and 23B.

The structure of the data recording layer 10 of embodiment example 2 was similar to that of embodiment example 1; the difference of embodiment example 2 from embodiment example 1, in which the intermediate layer 42B is formed of a Ta film, is that a Ru film or a Mg film was used as the intermediate layer 42B. FIG. 26 is a graph showing an example of the magnetization curve in a case where an external field was applied to a data recording layer structured as shown in FIGS. 23A and 23B. The vertical axis represents the produce of the magnetization M and the film thickness t (arbitrary unit) and the horizontal axis represents the applied magnetic field (Oe). It should be noted that FIG. 26 shows the in-plane loop, which is the magnetization curve in a case where the external field H was applied in the in-plane direction. In FIG. 26, the magnetization curve E indicates the case where the Ta film is used as the intermediate layer 42B (embodiment example 1). The magnetization curve F indicates the case where the Ru film is used as the intermediate layer 42B, and the magnetization curve G indicates the case where the Mg film is used. The thickness of the Ru film, the Mg film and the Ta film was 1.0 nm and the samples were not subjected to thermal annealing.

As shown in FIG. 26, the in-plane loop for the Ta film (the magnetization loop E) showed the smallest slant angle and a high saturation field $H_S$. The difference in the magnetic properties of the Ru film and the Mg film from the Ta film can be considered as resulting from the difference in the fcc (111) orientation of the $[Co/Ni]_n$/Pt film stack. The above-described results showed that a Ta film was considerably suitable as the intermediate layer 42B for enhancing fcc (111) orientation, which is strongly related to perpendicular magnetic anisotropy of the $[Co/Ni]_n$/Pt film stack. The results also showed that a Ru film and a Mg film were not necessarily suitable as the intermediate layer 42B, at least when they were individually used. A Ru film or a Mg film may be usable in a form of a film stack including a Ta film.

Configurations of Magnetic Memory and Memory Cells

The magnetoresistance elements 100, 100A and 100B of the above-described embodiments may be used as memory cells in a magnetic memory. In the following, a description is given of exemplary structures of a magnetic memory and memory cells incorporated therein, in one embodiment.

Figure 27:
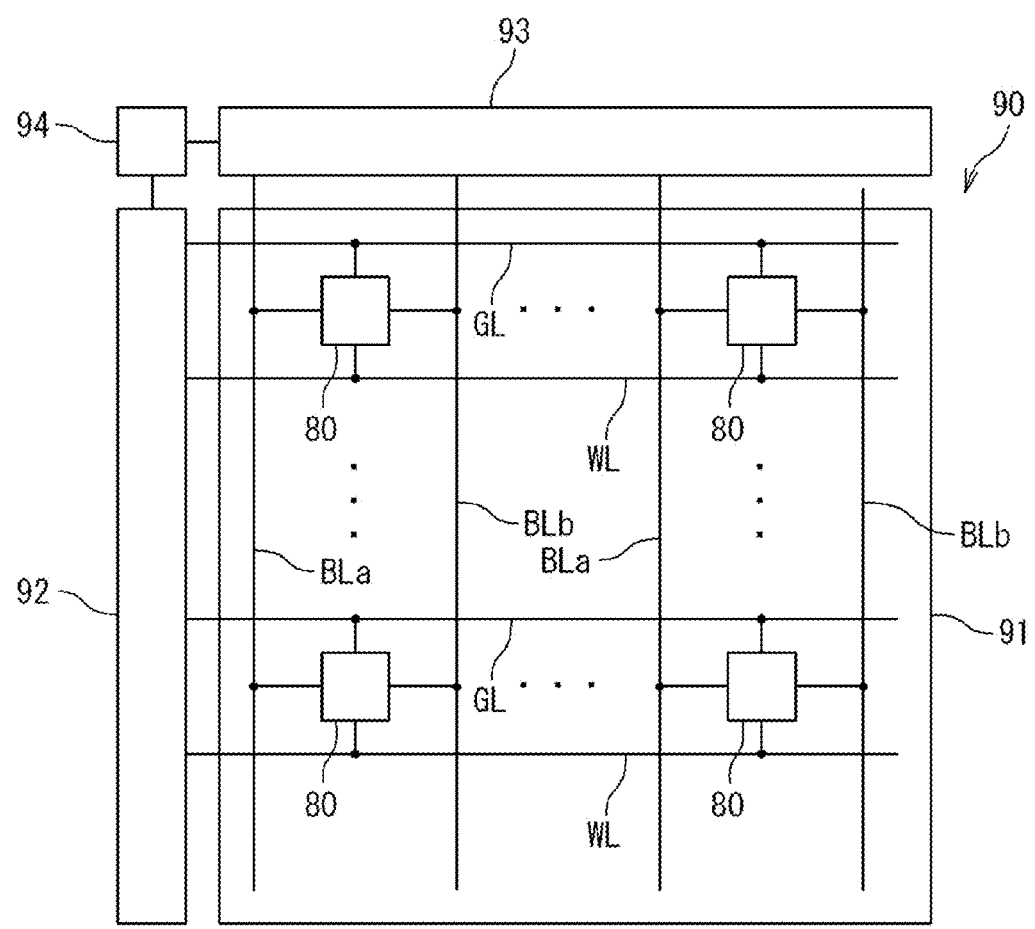
FIG. 27 is a block diagram showing an exemplary configuration of a magnetic memory in one embodiment of the present invention.

FIG. 27 is a block diagram showing an exemplary configuration of a magnetic memory 90 in one embodiment of the present invention. The magnetic memory 90 includes a memory cell array, an X driver 92, a Y driver 93 and a controller 94. The memory cell array 91 includes a plurality of memory cells 80 arranged in an array, a plurality of word lines WL, a plurality of pairs of bit lines BLa, BLb, a plurality of ground lines GL. Each memory cell 80 is connected to the corresponding word line WL, the corresponding ground line GL and the corresponding pair of bit lines BLa and BLb. The X driver 92 drives the word line connected to the memory cell 80 to be accessed, which is selected from the plurality of word lines WL. The Y driver 93 is connected to the pairs of the bit lines BLa and BLb, and drives each bit line to a desired state depending on the write operation and the read operation. The controller 94 controls the X driver 92 and the Y driver 93 depending on the write operation and the read operation.

Figure 28:
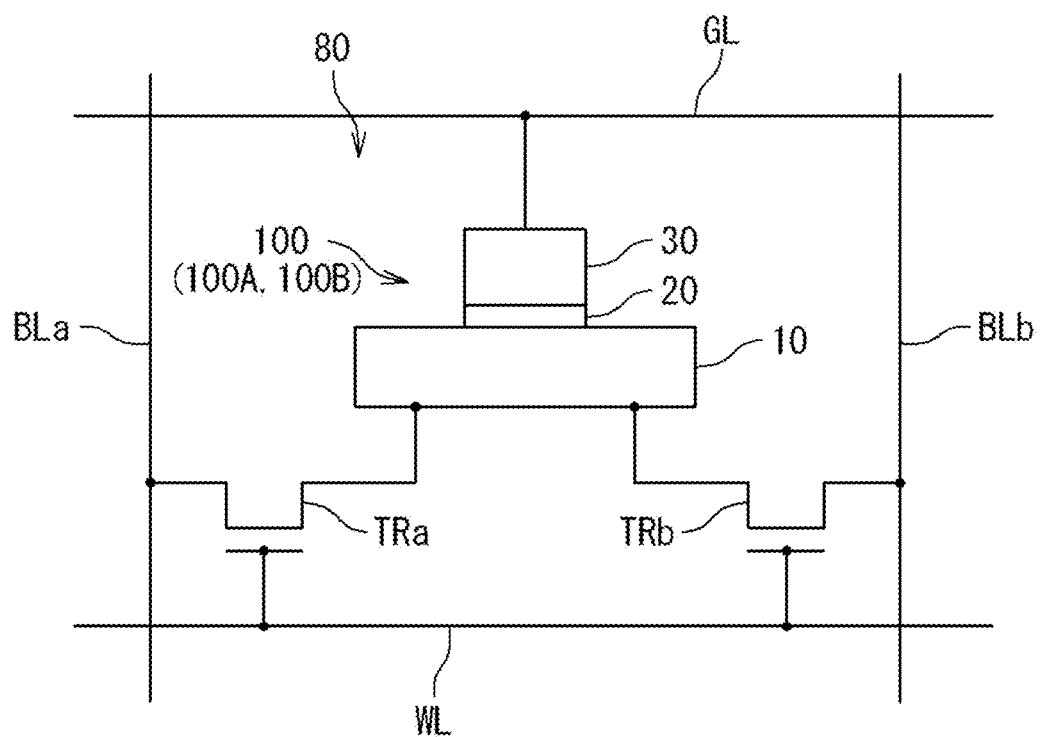
FIG. 28 is a circuit diagram schematically showing an exemplary configuration of a memory cell in one embodiment of the present invention.

FIG. 28 is a schematic circuit diagram showing an exemplary configuration of the memory cells 80 in one embodiment of the present invention. Each memory cell, which is structured as a 2T-1MTJ (two transistors-one magnetic tunnel junction) structure, includes a magnetoresistance effect element described above (100, 100A or 100B), and a pair of transistors TRa and TRb. The magnetoresistance effect element (100, 100A or 100B) includes three terminals. The terminal connected to the reference layer 30 of the magnetoresistance effect element (100, 100A or 100B) is connected to the corresponding ground line GL. The terminal connected to the magnetization fixed regions 11a of the data recording layer 10 is connected to the corresponding bit line BLa via the transistor TRa, and the terminal connected to the magnetization fixed regions 11b of the data recording layer 10 is connected to the corresponding bit line BLa via the transistor TRa. The gates of the transistor TRa and TRb are commonly connected to the word line WL.

The access to the memory cell 80 is achieved as follows: In the write operation, the word line WL is set to the high level to turn on the transistors TRa and TRb. In addition, one of the bit lines BLa and BLb is set to the high level and the other is set to the low level (the ground level). As a result, a write current is flown between the bit lines BLa and BLb via the transistors TRa, TRb and the data recording layer 10. This achieves writing desired data into the data recording layer 10.

In the read operation, on the other hand, the word line WL is set to the high level to turn on the transistors TRa and TRb. The bit line BLa is placed into the high impedance state and the bit line BLb is set to the high level. As a result, a read current Iread is flown from the bit line BLb to the ground line GL via the MTJ of the magnetoresistance effect element (100, 100A or 100B). The data stored in the data recording layer 10 of the magnetoresistance effect element are identified by detecting the read current Iread.

Although embodiments and embodiment examples of the present invention are specifically described above, the present invention should not be interpreted as being limited to the above-described embodiments and embodiment examples. It should be noted that the present invention may be implemented with various changes and modifications apparent to the person skilled in the art.

What is claimed is:
1. A magnetic memory, comprising:
a magnetization fixed layer having perpendicular magnetic anisotropy, a magnetization direction of said magnetization fixed layer being fixed;
an amorphous interlayer dielectric;
an underlayer formed on upper faces of said magnetization fixed layer and said interlayer dielectric; and
a data recording layer formed on an upper face of said underlayer and having perpendicular magnetic anisotropy,
wherein said underlayer includes:
a first underlayer formed in contact with the upper faces of said interlayer dielectric and said magnetization fixed layer; and
a second underlayer formed on said first underlayer,
wherein said second underlayer is non-magnetic, and
wherein said first underlayer intrinsically exhibits ferromagnetism, while said first underlayer is formed with such a thickness that said first underlayer does not exhibit ferromagnetism in a portion of said first underlayer formed on said interlayer dielectric.

2. The magnetic memory according to claim 1, wherein said first underlayer includes NiFe as a major constituent and includes at least one non-magnetic element selected from the group consisting of Zr, Ta, W, Hf, and V.

3. The magnetic memory according to claim 2, wherein said first underlayer has a thickness in a range from 0.5 nm to 3 nm.

4. The magnetic memory according to claim 3, wherein the thickness of said first underlayer is less than 2 nm.

5. The magnetic memory according to claim 2, wherein a concentration of said at least one non-magnetic element in said first underlayer is in a range from 10 to 25 atomic %.

* * * * *